United States Patent
Wolf et al.

(10) Patent No.: US 6,209,114 B1
(45) Date of Patent: Mar. 27, 2001

(54) EFFICIENT HARDWARE IMPLEMENTATION OF CHIEN SEARCH POLYNOMIAL REDUCTION IN REED-SOLOMON DECODING

(75) Inventors: Tod D. Wolf, Richardson; Jonathan H. Shiell, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/087,584

(22) Filed: May 29, 1998

(51) Int. Cl.$^7$ .............................. H03M 13/00; G06F 7/00
(52) U.S. Cl. ............................................. 714/784; 708/492
(58) Field of Search ................................. 714/781, 184, 714/752, 782; 708/490, 492

(56) References Cited

U.S. PATENT DOCUMENTS

| | | | | |
|---|---|---|---|---|
| 5,323,402 | * | 6/1994 | Vaccaro et al. | 714/782 |
| 5,414,719 | * | 5/1995 | Iwaki et al. | 714/785 |
| 5,715,262 | * | 2/1998 | Gupta | 714/784 |
| 5,974,582 | * | 10/1999 | Ly | 714/781 |
| 5,983,389 | * | 11/1999 | Shimizu | 714/781 |

OTHER PUBLICATIONS

Araki, Kiyomichi, et al.; Modified Euclidean Algorithm Having High Mudularity and Minimum Register Organization, IEICE Transaction, vol. E 74, No. 4, Apr. 1991, pp. 731–737.

Reed, I.S., et al.; Polynomial Codes Over Certain Finite Fields, J. Soc. Indust. Appl. Math., vol. 8, No. 2, Jun. 1960, pp. 300–304.

Kwon, S et al., An Area–efficient Vlsi Architecture of A Reed–Solomon Decoder/Encoder for Digital VCRs, IEEE, pp. 1019–1027, Jun. 1997.*

Moon Ho Lee et al. A High Speed Reed–Solomon Decoder, IEEE, pp. 1142–1148, Jul. 1995.*

Tong, Po A 40–MHZ Encoder–Decoder Chip Generated by a Reed–Solomon Code Compiler, IEEE, pp. 13.5.1–13.5.4, Jun. 1997.*

* cited by examiner

Primary Examiner—Albert De Cady
Assistant Examiner—Shelly A Chase
(74) Attorney, Agent, or Firm—Robert D. Marshall, Jr.; W. James Brady, III; Frederick J. Telecky, Jr.

(57) ABSTRACT

A programmable logic device, such as a digital signal processor (DSP) (130), having a Chien search unit (116) is disclosed. The Chien search unit (116) is arranged to perform finite field arithmetic functions useful in identifying roots of a polynomial, as is useful in Reed-Solomon decoding, particularly, after the execution of a Euclidean array function. Galois field multipliers (306) perform finite field multiplication of coefficient values ($\Lambda$) and powers of symbol values ($\alpha$); the products of such multiplications are written into the coefficient register (304) for use in connection with the next symbol value. Finite field adders (308, 310; 318, 320) produce a final sum that is interrogated by zero detection circuitry (206) to determine whether a root is presented by the current symbol value. The provision of a Chien search execution unit (116) provides important efficiency so as to enable programmable logic devices, such as digital signal processors (130) and microprocessors to effect Reed-Solomon decoding.

15 Claims, 12 Drawing Sheets

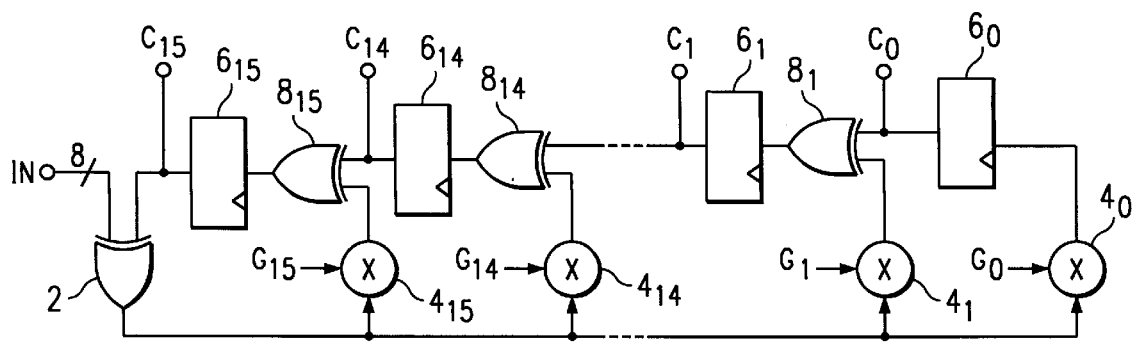
FIG. 1
*(PRIOR ART)*
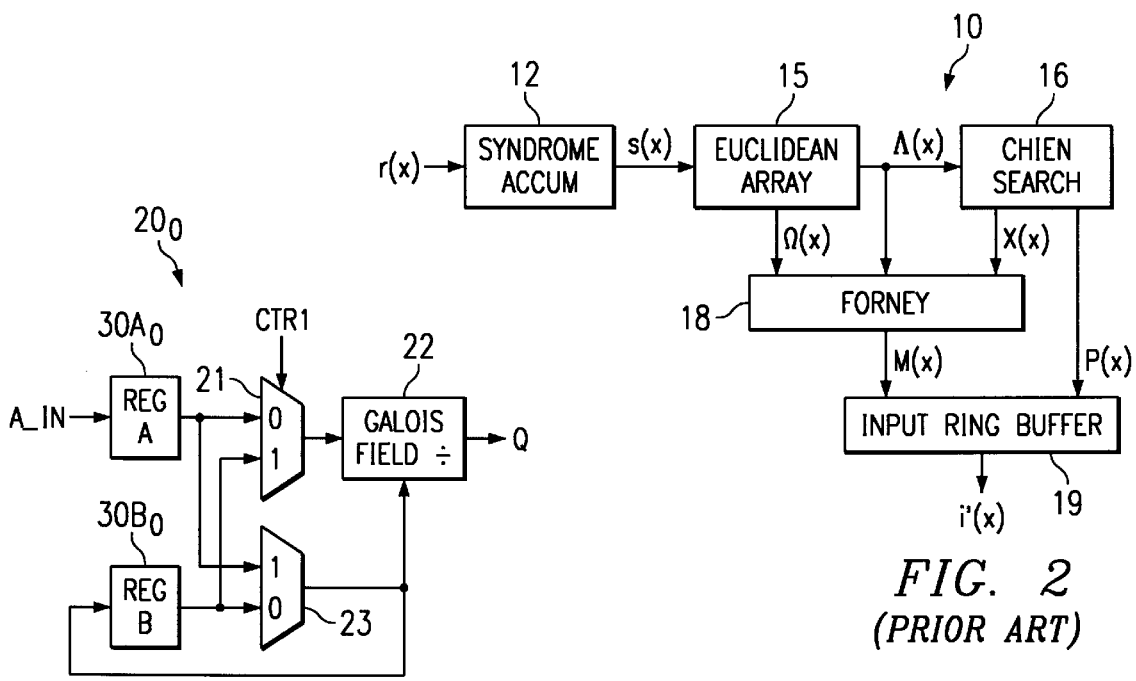
FIG. 2
*(PRIOR ART)*
FIG. 3a
*(PRIOR ART)*
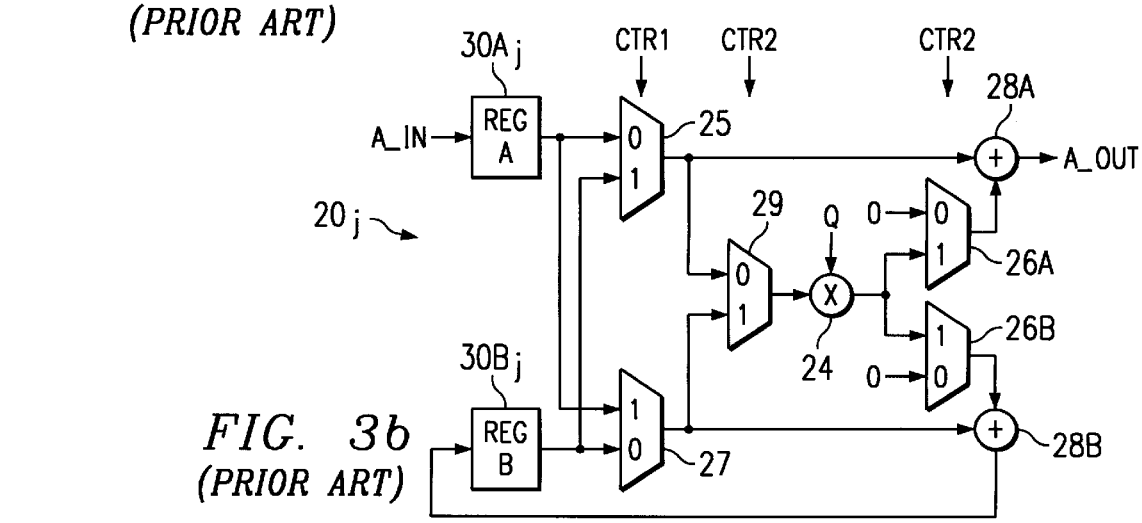
FIG. 3b
*(PRIOR ART)*

EFFICIENT HARDWARE IMPLEMENTATION OF CHIEN SEARCH POLYNOMIAL REDUCTION IN REED-SOLOMON DECODING

CROSS-REFERENCE TO RELATED APPLICATIONS

This application is related to copending application Ser. No. 09/087,997, entitled "An Efficient Hardware Implementation of Euclidean Array Processing in Reed-Solomon Decoding", filed contemporaneously herewith, and commonly assigned herewith, now U.S. Pat. No. 5,951,677 issued Sep. 14, 1999.

BACKGROUND OF THE INVENTION

This invention is in the field of integrated circuits for data communication, and is more specifically directed to error correction methods in the receipt of such communications.

Recent advances in the electronics field have now made high-speed digital data communications prevalent in many types of applications and uses. Digital communication techniques are now used for communication of audio signals for telephony, with video telephony now becoming available in some locations. Digital communication among computers is also prevalent, particularly with the advent of the Internet; of course, computer-to-computer networking by way of dedicated connections (e.g., local-area networks) and also by way of dial-up connections has also become prevalent in recent years.

Of course, the quality of communications carried out in these ways depends upon the accuracy with which the received signals match the transmitted signals. Some types of communications, such as audio communications, can withstand bit loss to a relatively large degree. However, the communication of digital data, especially of executable programs, requires exact fidelity in order to be at all useful. Accordingly, various techniques for the detection and correction of errors in communicated digital bit streams have been developed. Indeed, error correction techniques have effectively enabled digital communications to be carried out over available communication facilities, such as existing telephone lines, despite the error rates inherent in high-frequency communication over these facilities.

Error correction may also be used in applications other than the communication of data and other signals over networks. For example, the retrieval of stored data by a computer from its own magnetic storage devices also typically utilizes error correction techniques to ensure exact fidelity of the retrieved data; such fidelity is, of course, essential in the reliable operation of the computer system from executable program code stored in its mass storage devices. Digital entertainment equipment, such as compact disc players, digital audio tape recorders and players, and the like also now typically utilize error correction techniques to provide high fidelity output.

An important class of error detection and error correction techniques is referred to as Reed-Solomon coding, and was originally described in Reed and Solomon, "Polynomial Codes over Certain Finite Fields", *J. Soc. for Industrial and Applied Mathematics*, Vol. 8 (SIAM, 1960), pp. 300–304. Reed-Solomon coding uses finite-field arithmetic, such as Galois field arithmetic, to map blocks of a communication into larger blocks. In effect, each coded block corresponds to an over-specified polynomial based upon the input block. Considering a message as made up of k m-bit elements, a polynomial of degree n−1 may be determined as having N coefficients; with N greater than k (i.e., the polynomial is overspecified), not all of the N coefficients need be valid in order to fully and accurately recover the message. According to Reed-Solomon coding, the number t of errors that may be corrected is determined by the relationship between N and k, according to $$t \leq \frac{N-k}{2}.$$

Reed-Solomon encoding is used to generate the encoded message in such a manner that, upon decoding of the received encoded message, the number and location of any errors in the received message may be determined. Conventional Reed-Solomon encoder and decoder functions are generally implemented, in microprocessor-based architectures, as dedicated hardware units that are not in the datapath of the central processing unit (CPU) of the system, as CPU functionality has not heretofore been extended to include these functions.

In this regard, FIG. 1 illustrates one example of an architecture for a conventional Reed-Solomon encoder, for the example where each symbol is eight bits, or one byte, in size (i.e., m=8), where Galois field arithmetic is used such that the size of the Galois field is $2^8$, and where the maximum codeword length is $2^8-1$, or 255 symbols. Of course, other architectures may be used to derive the encoded codeword for the same message and checksum parameters, or of course for other symbol sizes, checksum lengths, or maximum codeword lengths. In the example of FIG. 1, sixteen check symbols are generated for each codeword, and as such eight errors per codeword may be corrected. According to conventional Reed-Solomon encoding, the k message bytes in the codeword ($M_{k-1}$, $M_{k-2}$, ..., $M_0$) are used to generate the check symbols ($C_{15}$, $C_{14}$, ..., $C_0$). The check symbols C are the coefficients of a polynomial C(x)

$$C(x) = C_{15}x^{15} + C_{14}x^{14} + \ldots + C_0$$

which is the remainder of the division of a message polynomial M(x) having the message bytes as coefficients:

$$M(x) = M_{k-1}x^{k-1} + M_{k-2}x^{k-2} + \ldots + M_0$$

by a divisor referred to as generator polynomial G(x):

$$G(x) = (x-a^0)(x-a^1)(x-a^2)\ldots(x-a^{15})$$

where each value is a root of the binary primitive polynomial $x^8+x^4+x^3+x^2+1$. The exemplary architecture of FIG. 1 includes sixteen eight-bit shift register latches $6_{15}$ through $6_0$, which will contain the remainder values from the polynomial division, and thus will present the checksum coefficients $C_{15}$ through $C_0$, respectively. An eight-bit exclusive-OR function $8_{15}$ through $8_1$ is provided between each pair of shift register latches 6 to effect Galois field addition, with XOR function $8_{15}$ located between latches $6_{15}$ and $6_{14}$, and so on. The feedback path produced by exclusive-OR function 2, which receives both the input symbol and the output of the last latch $6_{15}$, presents the quotient for each division step. This quotient is broadcast to sixteen constant Galois field multipliers $4_{15}$ through $4_0$, which multiply the quotient by respective ones of the coefficients $G_{15}$ through $G_0$. In operation, the first k symbols contain the message itself, and are output directly as the leading portion of the codeword. Each of these message symbols enters the encoder architecture of FIG. 1 on lines IN, and is applied to the division operation carried out by this encoder. Upon completion of the operations of the architecture of FIG. 1 upon these message bytes, the remainder values retained in shift register latches $6_{15}$ through $6_0$ correspond to the checksum symbols $C_{15}$ through $C_0$, and are appended to the encoded codeword after the k message symbols.

The encoded codewords are then communicated in a digital bitstream, and communicated in the desired manner, after the appropriate formatting. For communications over telephone facilities, of course, the codewords may be communicated either digitally or converted to analog signals; digital network or intracomputer communications will, of course, maintain the codewords in their digital format. Regardless of the communications medium, errors may occur in the communicated signals, and will be reflected in the received bitstream as opposite binary states from those in the input bitstream, prior to the encoding process of FIG. 1. These errors are sought to be corrected in the decoding process, as will now be described in a general manner relative to FIG. 2.

An example of the decoding of Reed-Solomon encoded codewords, generated for example by the architecture of FIG. 1, is conventionally carried out in the manner now to be described relative to decoder 10 illustrated in FIG. 2. Decoder 10 receives an input bitstream of codeword symbols, which is considered, for a single codeword, as received polynomial r(x) in FIG. 2. Received polynomial r(x) is applied to syndrome accumulator 12, which generates a syndrome polynomial s(x) of the form:

$$s(x)=s_{i-1}x^{i-1}+s_{i-2}x^{i-2}+\ldots+s_1x+s_0$$

Syndrome polynomial s(x) is indicative of whether errors were introduced into the communicated signals over the communication facility. If s(x)=0, no errors were present, but if s(x) is non-zero, one or more errors are present in the codeword under analysis. Syndrome polynomial s(x), in the form of a sequence of coefficients, is then forwarded to Euclidean array function 15.

Euclidean array function 15 generates two polynomials Λ(x) and Ω(x) based upon the syndrome polynomial s(x) received from syndrome accumulator 12. The degree ν of polynomial Λ(x) indicates the number of errors in the codeword, and as such is forwarded to Chien search function 16 for additional analysis. Polynomial Ω(x) is also generated by Euclidean array function 15, and is forwarded to Forney function 18; polynomial Ω(x) is used by Forney function 18 to evaluate the error in the received bitstream r(x).

Referring now to FIGS. 3a and 3b, the construction of Euclidean array function 15 according to a known approach will now be described. The construction and operation of Euclidean array function 15 as illustrated in FIGS. 3a and 3b is described in further detail in Araki, et al., "Modified Euclidean Algorithm having High Modularity and Minimum Register Organization", *Trans. IEICE*, Vol. E-74, No. 4 (IEICE, 1994), pp. 731–737. As described therein, Euclidean array function 15 is constructed as cells 20, numbering 2t+5 where t is the number of correctable errors in a codeword; the most significant cell $20_0$ is constructed differently from the remaining cells $20_1$ to $20_{2t+4}$, which are constructed identically. According to this known technique for realizing Euclidean array function 15, two registers A and B, each with 2t+5 elements in this example, are used to receive the syndrome polynomial s(x) coefficients, and to generate the coefficients in result polynomials Λ(x) and Ω(x).

FIG. 3a illustrates the construction of most significant cell $20_0$ in Euclidean array function 15. Cell $20_0$ effects either a swap of the A and B position values, followed by a Galois field constant division process, and forwards the result on lines Q to cells $20_j$ in Euclidean array function 15. The most significant position $30A$) in register A receives an input on lines A_IN, and has an output applied to multiplexers 21, 23, while the most significant position $30B_0$ in register B has its output also applied to multiplexers 21, 23. The output of multiplexer 21 is applied to Galois field divider 22, while the output of multiplexer 23 is applied both to Galois field divider 22 and to most significant position $30B_0$ in register B. Multiplexers 21, 23 are controlled by control line CTR1 to select, in one state, the contents of most significant position $30A_0$ as the dividend applied to divider 22, and the contents of most significant position $30B_0$ as the divisor applied to divider 22, and in another state to swap the A and B values, so that most significant position $30B_0$ is the dividend and most significant position $30A_0$ is the divisor. In either case, the divisor operand is restored into most significant position $30B_0$ in register B. The quotient output of divider 22 is presented on lines Q for use by the other cells $20_j$ as will now be described relative to FIG. 3b.

As shown in FIG. 3b, each cell $20_j$ utilizes the contents of the jth position of each of registers A, B (namely positions $30A_j$ and $30B_j$). In the conventional custom logic realization of Euclidean array function 15, as described in the Araki et al. reference, cells $20_j$ are connected in sequence, with the A_OUT lines from one cell $20_j$ serving as the A_IN lines in an adjacent cell $20_{j+1}$. Swapping of the A and B values is effected by multiplexers 25, 27 in cell $20_j$, under the control of control line CTR1, as described above. The output of multiplexer 25 is applied to Galois field adder 28A for generating a new A value on lines A_OUT, and is also applied to one input of multiplexer 29. The output of multiplexer 27 is similarly applied to Galois field adder 28B, which generates the contents of jth position $30B_j$ of register B, and is also applied to another input of multiplexer 29. Multiplexer 29 selects one of the outputs of multiplexers 25, 27, under the control of control line CTR2, for application to Galois field multiplier 24, for multiplication by the value Q from the most significant cell $20_0$. The output of multiplier 24 is applied to one input of each of multiplexers 26A, 26B, the other inputs of which receive hard-wired zero levels; multiplexers 26A, 26B have their outputs connected to Galois field adders 28A, 28B, respectively, and are under the control of control line CTR2. The output of Galois field adder 28A will serve as the $A_{j+1}$ operand in the next pass through Euclidean array function 15, and as such is shifted into A register location $30A_{j+1}$ on lines A_OUT, while the output of Galois field adder 28B is applied to register B location $30B_j$ for the next pass.

In operation, this conventional Euclidean array function 15 process stores two polynomials in each of the A and B registers. These polynomials are appended to one another to occupy left and right portions of these registers; as such, the left and right polynomials will be referred to as $A_{left}$, $A_{right}$, $B_{left}$, $B_{right}$. The boundaries between the left and right polynomials within the A and B registers move during the Euclidean process, as will now be described relative to FIGS. 4a, 4b and 5.

FIG. 4a illustrates the initial state of A and B registers 30A, 30B prior to operation by Euclidean array function 15. In this conventional approach, polynomial $A_{left}$ stores the syndrome coefficients generated by syndrome accumulator 12, with polynomial Aright storing all zeroes. Polynomial $B_{left}$ stores the value $x^{2t}$ (which, in this example, is a leading one followed by all zeroes), while polynomial $B_{right}$ stores the value one. Referring now to FIG. 5, the operation of Euclidean array function 15 begins with process 31 comparing the degree of polynomial $A_{left}$ to that of polynomial $B_{left}$; if polynomial $A_{left}$ has a degree less than that of polynomial $B_{left}$, control signal CTR1 is set to "1" (in process $32_1$) to effect a swap in all of cells 20, otherwise control signal CTR1 is set to "0" (in process $32_0$). Process 34 then determines the location of the boundaries between the left and right polynomials in A and B registers 30A, 30B.

Each cell 20 of Euclidean array function 15 is associated with corresponding locations of A and B registers 30A, 30B, as noted above. Upon process 34 determining the location of the polynomial boundaries in A and B registers 30A, 30B, those cells 20 which are associated with left polynomial locations of A and B registers 30A, 30B have their control signal CTR2 set to "1" in process 36, while those cells 20 associated with right polynomial locations of A and B registers 30A, 30B have their control signal CTR2 set to "0". Process 38 then executes cell $20_0$ of FIG. 2a upon the contents of register locations $30A_0$ and $30B_0$, generating the Q value for use in each of the other cells $20_j$, and also generating new values for register locations $30A_0$ and $30B_0$. Process 40 then executes each of cells $20_j$ upon the remaining locations of registers 30A, 30B, generating new values for each location therein. Process 42 then evaluates the degree of polynomial $A_{left}$ (which corresponds to the syndrome polynomial s(x) as modified by the passes through Euclidean array function 15), and decision 43 compares this degree to the maximum number t of correctable errors. If the degree of polynomial $A_{left}$ is greater than or equal to t, the operation of Euclidean array function 15 is not yet complete, and the operation repeats from process 31.

However, if the degree of polynomial $A_{left}$ is less than t, the process of Euclidean array function 15 is essentially complete. At this point, A register 30A contains the coefficients of polynomial $\Omega(x)$ in polynomial $A_{left}$, while B register 30B contains the coefficients of polynomial $\Lambda(x)$ in polynomial $B_{right}$, as shown in FIG. 4b. Process 44 is then performed to normalize these values, by dividing each coefficient by the value $\Delta$ (which is the lowest degree coefficient $\Lambda(0)$ from polynomial $B_{right}$. These divided coefficients of polynomials $\Omega(x)$ and $\Lambda(x)$ are then forwarded to Forney function 18 and Chien search function 16, as shown in FIG. 2. Chien search function 16 utilizes polynomial $\Lambda(x)$, generally referred to as the error locator polynomial, to generate the zeroes polynomial X(x) from which Forney function 18 determines the error magnitude polynomial M(x). Chien search function 16 also generates polynomial P(x), which indicates the position of the errors in the received bitstream r(x). The magnitude of the errors as indicated by polynomial M(x) and the position of these errors as indicated by polvnomial P(x), are then used by input ring buffer 19 to generate the corrected bitstream i'(x).

The above description of conventional Euclidean array function 15 illustrates an approach by way of which the Euclidean array algorithm may be implemented in specific hardware, such as in a custom logic device. As is well known in the art, however, the advent of high performance programmable devices, such as digital signal processors (DSPs) and general-purpose microprocessors, favors the use of such programmable devices for many complex and time-consuming operations encountered in modern data processing and communications applications. Programmable devices are especially useful for such operations if parameters of the operation either change over time, or may be dependent upon environment or implementation. As such, it is desirable to effect the Euclidean array function described hereinabove in a programmable device, such as a DSP or microprocessor.

However, it is cumbersome for conventional programmable logic devices to execute finite field arithmetic operations, such as the Galois field multiplication and division performed in Euclidean array function 15 described hereinabove. For the case of a modern DSP, such as the TMS320c6X digital signal processor available from Texas Instruments Incorporated, Galois field addition, multiplication, and division operations require one, twelve, and seventeen clock cycles to perform. Considering that the Euclidean array function 15 utilizes 2t+5 cells 20, one Galois field division, 2(2t+4) Galois field additions, and 2t+4 Galois field multiplications are performed in each iteration, causing the number of clock cycles for execution of Euclidean array function 15 to escalate rapidly. For a typical example in which the number of correctable errors t is ten, and assuming twenty repetitions through the process of FIG. 5 described above, execution of Euclidean array function 15 using this conventional DSP would require 7,060 clock cycles (960 for additions, 5760 for multiplications, and 340 for divisions) for each received codeword.

As noted above, the coefficients of the error locator polynomial $\Lambda(x)$ generated by Euclidean array function 15 are applied to Chien search function 16 in this conventional Reed-Solomon decoder. Chien search function 16 utilizes these coefficients, along with the particular finite field "alphabet", or set of finite field values, to generate two polynomials that are used in further identifying the errors in the received bitstream r(x). One polynomial generated by Chien search function 16 is generally referred to as zeroes polynomial X(x), which is applied to Forney function 18 for determination of the eventual error magnitude polynomial M(x). Chien search function 16 also generates error position polynomial P(x), which is forwarded to input ring buffer 19 as an indication of the position of the errored symbols in the bitstream r(x).

Similarly, and by way of further background, a conventional example of Chien search function 16, as implemented by way of custom logic circuitry, will now be described relative to FIG. 11. In this conventional approach, Chien search function 16 includes root detection block 200. Root detection block 200 evaluates the following function:

$$X_i = \Lambda(\alpha^i) = \Lambda_0 + \sum_{j=1}^{v} \Lambda_j(\alpha^i)^j \quad \text{for } i = 1 \text{ to } 255$$

where the term $\alpha^i$ refers to the symbol alphabet for GF(256) Galois field arithmetic, which has 256 members. As noted above, the term v is the degree of the error locator polynomial $\Lambda(x)$ from Euclidean array function 15, and as such corresponds to the number of errors present in the received bitstream r(x). Because v is less than or equal to the number t of correctable errors for successful decoding, the calculation is generally carried out up for index j from 1 to t. Root detection block 200 performs this evaluation, in the example of FIG. 11, by way of multiple weighted sum blocks 202, in combination with a Galois field, finite field, adder 204 and zero detection circuitry 206, as will now be described.

As shown in FIG. 11, the lowest order coefficient $\Lambda(0)$ of error locator polynomial $\Lambda(x)$ is forwarded directly to Galois field adder 204. Each of the next higher order coefficients $\Lambda(x)$, the number of which is the number t of correctable errors, are each forwarded to a corresponding one of weighted sum blocks 202, along with a corresponding power of the Galois field member $\alpha^i$. Because of the recursive construction of weighted sum blocks 202, as will be described below, the Galois field members ui applied thereto may be maintained as constants. For example, weighted sum block 202₁ receives the first power Galois field member $\alpha^1$ along with coefficient $\Lambda(1)$, weighted sum block 202₂ receives the square, or second power, Galois field member $\alpha^2$ along with coefficient $\Lambda(2)$, and so on. Each of the first t powers of the Galois field symbol alphabet members $\alpha^i$ (i=1 to t) may be prestored in memory, to prevent the repeated calculation of the powers of $\alpha$.

Each weighted sum block 202 is similarly constructed in conventional Galois field function 16, including a multiplexer 203, a register 205, and a finite field (Galois field) multiplier 207. Each of weighted sum blocks 202 is similarly constructed. In operation, considering that the zeroth order Galois field member $\alpha^0$ is one, multiplexer 203 in each of weighted sum blocks 202 first selects the coefficient $\Lambda$ for storage in register 205; the output of register 205 is applied to Galois field adder 204, for determination of the first sum and thus possible detection of a root. Galois field adder 204 performs a finite field addition of the contents of each of the registers 205 in weighted sum blocks 202, along with lowest order coefficient $\Lambda(0)$, to evaluate the polynomial $X_i$ for the ith symbol alphabet member $\alpha^i$. The result of this addition is applied to zero detection circuit 206, which drives an active state on line ZRO in response to the sum equaling zero; this event occurs when the current Galois field symbol alphabet member $\alpha^i$ is a root of the zeroes polynomial X(x). For the second and subsequent members of the Galois field symbol alphabet, the constant values of Galois field symbols $\alpha^1$ through $\alpha^t$ are applied to Galois field multiplier 207 along with the current contents of register 205. Galois field multiplier 207 again performs the finite field multiplication of these two operands, and multiplexer 203 selects the output of multiplier 207 for storage in register 205, and for presentation to Galois field adder 204 and zero detection circuit 206, to detect whether a root is present at this iteration.

For example, in the second iteration, multiplier 207 performs Galois field multiplication of symbol $\alpha^1$ and the value $\Lambda(1)$ (the current contents of register 205 after the first iteration), and thus stores the value $\Lambda(1)\alpha^1$ in register 205 and forwards this value to adder 204; weighted sum block 202₂ similarly generates and stores the value $\Lambda(2)\alpha^2$, as do the remaining weighted sum blocks 202, up to block 202$_t$ which generates and stores the value $\Lambda(t)\alpha^t$. In the third iteration, multiplier 207 in weighted sum block 202₁ performs a Galois field multiplication of symbol $\alpha^1$ and the value $\Lambda(1)\alpha^1$ (the then-current contents of register 205 after the second iteration), and stores and forwards the resulting value $\Lambda(1)(\alpha^1)^2$, or $\Lambda(1)\alpha^2$. Similarly, in this third iteration, weighted sum block 202₂ generates and stores the value $\Lambda(2)(\alpha^2)^2$, or $\Lambda(2)\alpha^4$, as do the remaining weighted sum blocks 202, up to block 202$_t$ which generates and stores the value $\Lambda(t)(\alpha^t)^2$. This process continues for iterations of the index value i (corresponding to the exponent of the $\alpha$ term in each multiplication) from 1 to 255 in the case of Galois field 256 operations, so that each symbol of the Galois field symbol alphabet is interrogated to determine whether it is a root.

Line ZRO is applied to the enable input of each stage of two registers 218, 220. Register 218 corresponds to the zeroes polynomial X(x), and includes stages 218₀ through 218$_t$ for storing coefficient values of zeroes polynomial X(x) therein. According to this conventional arrangement, index counter 208 maintains a count corresponding to the iteration of the Galois field symbol alphabet members a through root detection circuit 200. This count is applied to Galois field exponential circuit 212, typically constructed as a look-up ROM, which generates a magnitude value on lines MAG in response to the count; this magnitude is applied to the data inputs of register stages 218₀ through 218$_t$. According to the preferred embodiment of the invention, upon detection of a root of zeroes polynomial X(x) as indicated by an active state on line ZRO, the magnitude value on lines MAG is stored in the first available one of register stages 218₀ through 218$_t$; once the first one of the stages 218$_k$ of register 218 has a value stored therein, the magnitude value on lines MAG at the time of the next detected root is stored in the next stage 218$_k$ in sequence (218₀, then 218₁, and so on). Upon completion of the Chien search operation, register 218 will then store individual magnitude values for each of the detected roots. These values are forwarded, on lines X(0) through X(t), to Forney function unit 18.

The error position polynomial P(x) is also generated from the count stored in index counter 208. The output of index counter 208 is applied to an inverting input to adder 213, which receives the literal value "255" at a non-inverting input; the output of adder 213 is thus the quantity of 255 minus this count, and is applied to one input of multiplexer 215. The literal "0" value is applied to a second input of multiplexer 215, which is under the control of zero detection circuit 210 which detects when the count provided by index counter 208 reaches zero. Register 220 includes stages 220₀ through 220$_t$, which store position values in the form of coefficients of position polynomial P(x), each stage 220$_k$ receives line ZRO at an enable input and lines POS from the output of multiplexer 215 at a data input. In operation, upon root detection function 200 detecting a root of zeroes polynomial X(x), indicated by line ZRO being active, the value 255—i is stored in the first available stage 220$_k$ of register 220, such stored value indicating the position of the error in the received bitstream. Additional detected roots result in additional position values being stored in stages 220$_k$.

The above description of conventional Chien search function 16 illustrates an approach by way of which the Chien search reduction process may be implemented in dedicated, custom logic, hardware. As noted above, the use of programmable devices such as microprocessors and DSPs is generally favored in modern data processing and communications applications, making it is desirable to execute the Chien search operation in a programmable DSP or microprocessor. As in the case of the Euclidean array operation, however, it is cumbersome for conventional programmable logic devices to execute finite field arithmetic operations, such as the Galois field multiplication and addition performed in Chien search function 15 described hereinabove. In the above example of the Chien search operation, where the selected finite field is Galois field 256, 256 iterations are required to interrogate each member of the Galois field symbol alphabet. For the example where the number t of correctable errors is 8, eight Galois field additions (corresponding to the equivalent of eight adders in the realization of Galois field adder 204) and eight Galois field multiplications are required for each symbol alphabet member. In a TMS320c6x DSP, where twelve machine cycles are required for Galois field multiplication and one cycle is required for Galois field addition, a grand total of 26,624 (256 times 8 times 13) clock cycles are necessary to execute the Chien search operation for each received codeword.

BRIEF SUMMARY OF THE INVENTION

It is therefore an object of the present invention to provide an implementation of a Euclidean array function for use in a programmable logic device, such as a digital signal processor (DSP) or a microprocessor.

It is a further object of the present invention to provide such an Euclidean array implementation in association with a specific instruction.

It is a further object of the present invention to provide such an Euclidean array implementation having an efficient hardware implementation.

Other objects and advantages of the present invention will be apparent to those of ordinary skill in the art having reference to the following specification together with its drawings.

The present invention may be implemented in a programmable logic device, such as a digital signal processor (DSP) or a microprocessor, in which an execution unit for performing Chien search operations, responsive to a dedicated instruction, is provided. The Chien search unit includes registers for receiving coefficients corresponding to powers of a finite field symbol alphabet member, and registers for receiving error locator polynomial coefficients. A group of parallel finite field multipliers perform the multiplication of corresponding register locations, which are then forwarded to

BRIEF DESCRIPTION OF THE SEVERAL VIEWS OF THE DRAWING

FIG. 1 is an electrical diagram, in schematic form, of a conventional Reed-Solomon encoder architecture.

FIG. 2 is an electrical diagram, in block form, of a conventional Reed-Solomon decoder architecture.

FIGS. 3a and 3b are electrical diagrams, in schematic form, of cells in the Euclidean array function of the conventional Reed-Solomon decoder architecture of FIG. 2.

DETAILED DESCRIPTION OF THE INVENTION

According to the preferred embodiment of the present invention, a Chien search function is implemented as a functional unit within a programmable logic device realized as an integrated circuit This functional unit is preferably operated by way of a special instruction which presents the appropriate operands to the Chien search function, storing the results thereof in on-chip memory in a form in which the programmable logic device itself, or another integrated circuit operating in cooperation therewith, may utilize in receiving communications that are communicated thereto in Reed-Solomon encoded form. Of course, the particular architecture utilizing the function according to the preferred embodiment of the invention may vary from that described herein, it being understood that many different types of architectures and programmable logic devices may benefit from the use of the present invention. As such, it is to be understood that the following description is provided by way of example only, and is not intended to limit the scope of the present invention as hereinafter claimed.

Figure 6:
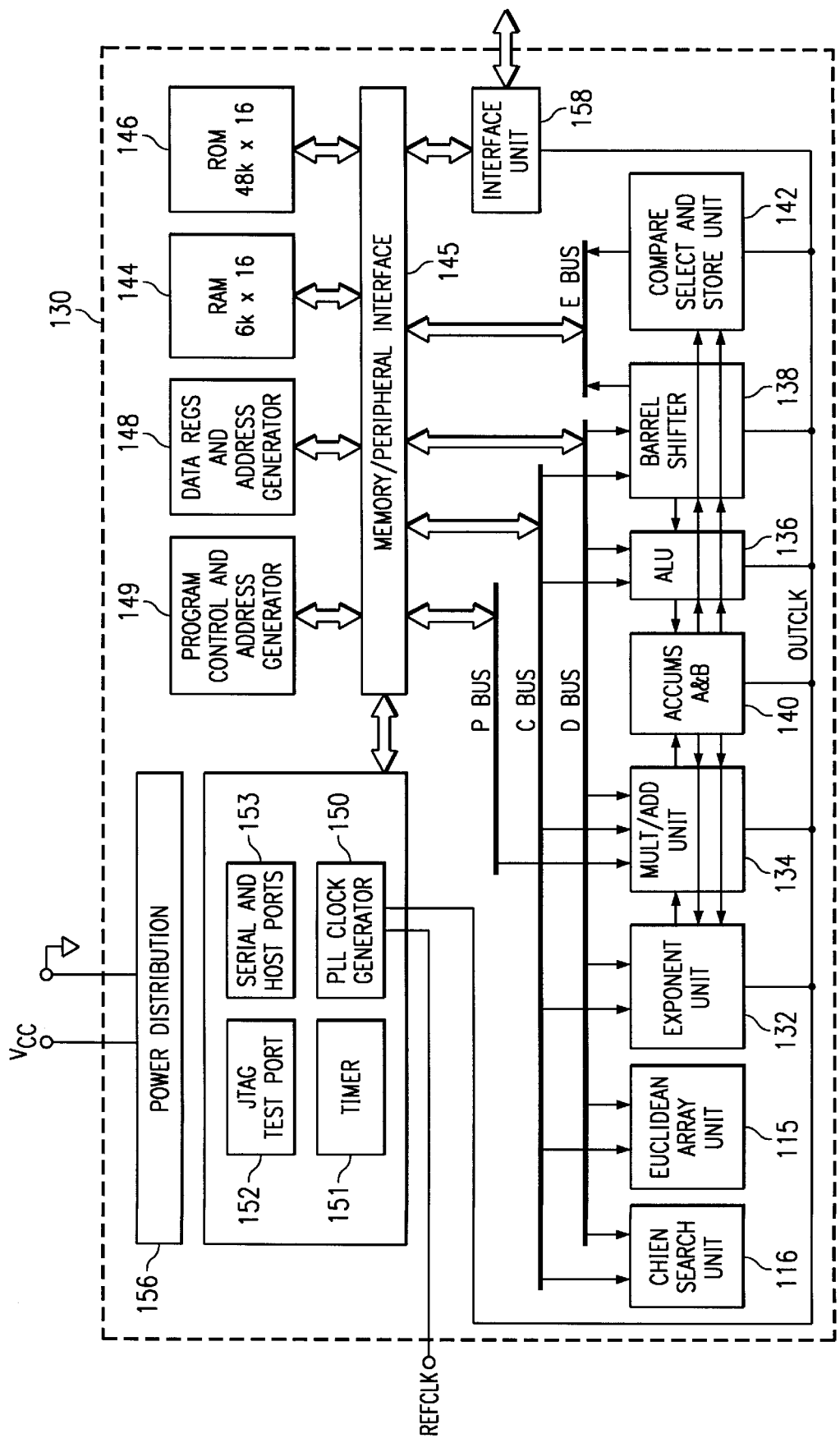
FIG. 6 is an electrical diagram, in block form, of a digital signal processor constructed according to the preferred embodiments of the invention.

An example of a programmable logic device, in the form of digital signal processor (DSP) integrated circuit 130, into which the preferred embodiment of the invention may be implemented is illustrated in FIG. 6. The architecture illustrated in FIG. 6 for DSP 130 is presented by way of example, as it will be understood by those of ordinary skill in the art that the present invention may be implemented into integrated circuits of various functionality and architecture, including custom logic circuits, general purpose microprocessors, and other VLSI and larger integrated circuits.

DSP 130 in this example is implemented by way of a modified Harvard architecture, and as such utilizes three separate data buses C, D, E that are in communication with multiple execution units including exponent unit 132, multiply/add unit 134, arithmetic logic unit (ALU) 136, barrel shifter 138; in addition, Euclidean array unit 115 and Chien search unit 116 are provided as execution units in DSP 130 according to the preferred embodiment of the present invention. Accumulators 140 permit operation of multiply/add unit 134 in parallel with ALU 136, allowing simultaneous execution of multiply-accumulate (MAC) and arithmetic operations. The instruction set executable by DSP 130, in this example, includes single-instruction repeat and block repeat operations, block memory move instructions, two and three operand reads, conditional store operations, and parallel load and store operations, as well as dedicated digital signal processing instructions. Additionally, as will be described in further detail hereinbelow, Euclidean array instructions and Chien search instructions are provided in the instruction set of DSP 130 according to the preferred embodiment of the invention. DSP 130 also includes compare, select, and store unit (CSSU) 142, coupled to data bus E, for accelerating Viterbi computation, as useful in many conventional communication algorithms.

DSP 130 in this example includes significant on-chip memory resources, to which access is controlled by memory/peripheral interface unit 145, via data buses C, D, E, and program bus P. These on-chip memory resources include random access memory (RAM) 144, read-only memory (ROM) 146 used for storage of program instructions, and data registers 148. Program controller and address generator circuitry 149 is also in communication with memory/peripheral interface 145, and receives program instruction code from ROM 146 or from other storage via memory/peripheral interface 145, and generates control signals applied to each of the functional units of DSP 130 to control the execution of instructions corresponding to the received program instruction code. Interface unit 58 is also provided in connection with memory/peripheral interface 145 to control external communications, as do serial and host ports 153. Additional control functions such as timer 151 and JTAG test port 152 re also included in DSP 130.

According to this preferred embodiment of the invention, the various logic unctions executed by DSP 130 are effected in a synchronous manner, according to one or more internal system clocks generated by PLL clock generator 150. In this exemplary implementation, PLL clock generator 150 directly or indirectly receives an external clock signal on line REFCLK, such as is generated by other circuitry in the system or by a crystal oscillator or the like, and generates internal system clocks, for example the clock signal on line OUTCLK, communicated (directly or indirectly) to each of the functional components of DSP 130. DSP 130 also includes power distribution circuitry 156 for receiving and distributing the power supply voltage and reference voltage levels throughout DSP 130 in the conventional maimer. Other functions, such as JTAG test interface circuitry; built-in self test circuitry, and the like may also be provided in DSP 130, in the conventional manner.

Figure 7:
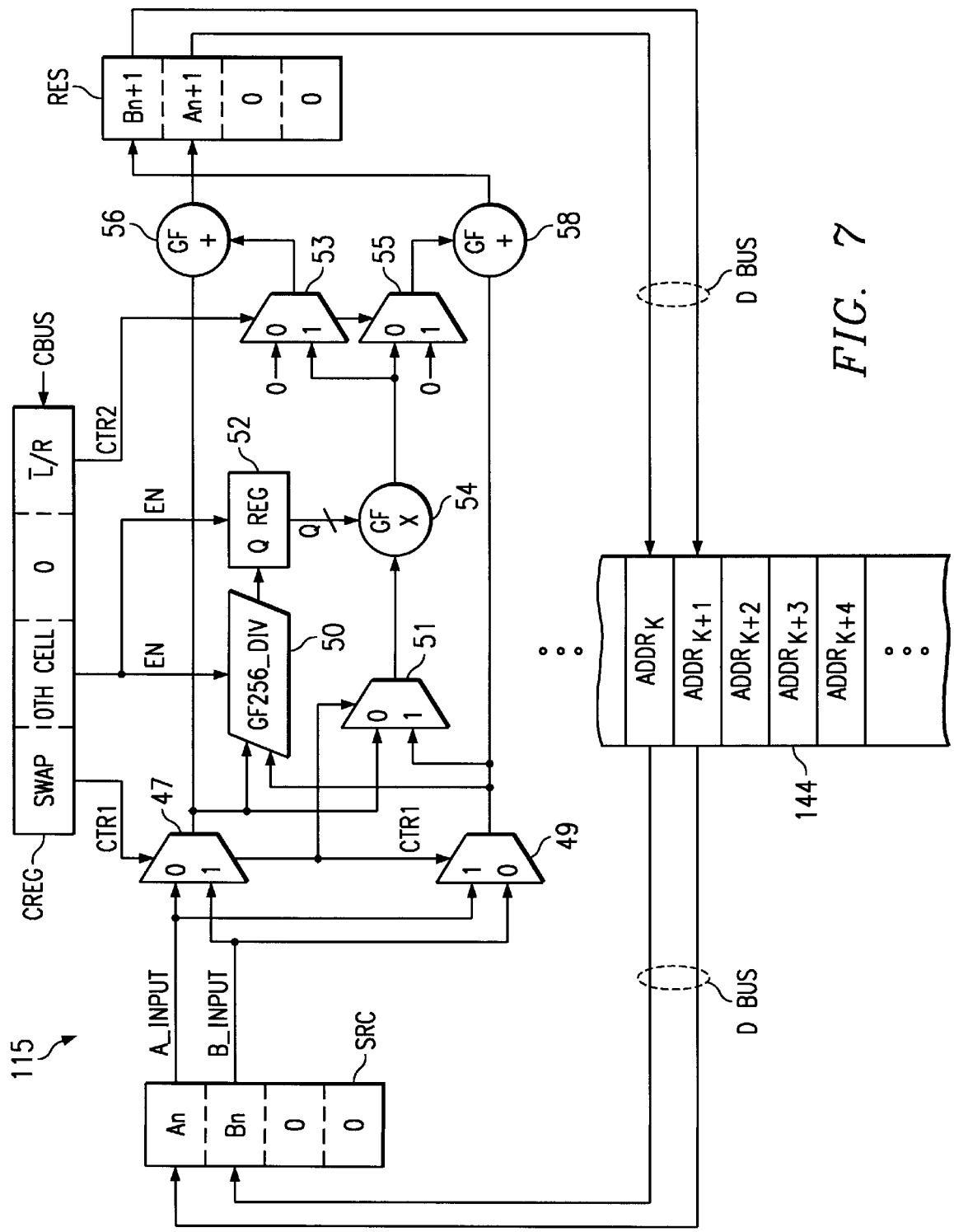
FIG. 7 is an electrical diagram, in block form, of a Euclidean array unit according to a first preferred embodiment of the invention.

Referring now to FIG. 7, the construction of Euclidean array unit 115 according to a first preferred embodiment of the present invention will now be described in detail. Euclidean array unit 115 performs the so-called "Euclidean" operation, which refers to the determination of the greatest common factor of two polynomials. In this embodiment of the invention, Euclidean array unit 115 operates upon operand values retrieved from RAM 144 (e.g., by way of a load instruction) and stores its results in RAM 144 (e.g., by way of a store instruction), both accesses being made by way of data bus D. The particular address in RAM 144 to which Euclidean array unit 115 writes data to or reads data from is maintained in a pointer register (not shown), in the conventional manner. Euclidean array unit 115 stores operands in source register SRC, and stores the results of its operation in result register REG.

Figure 5:
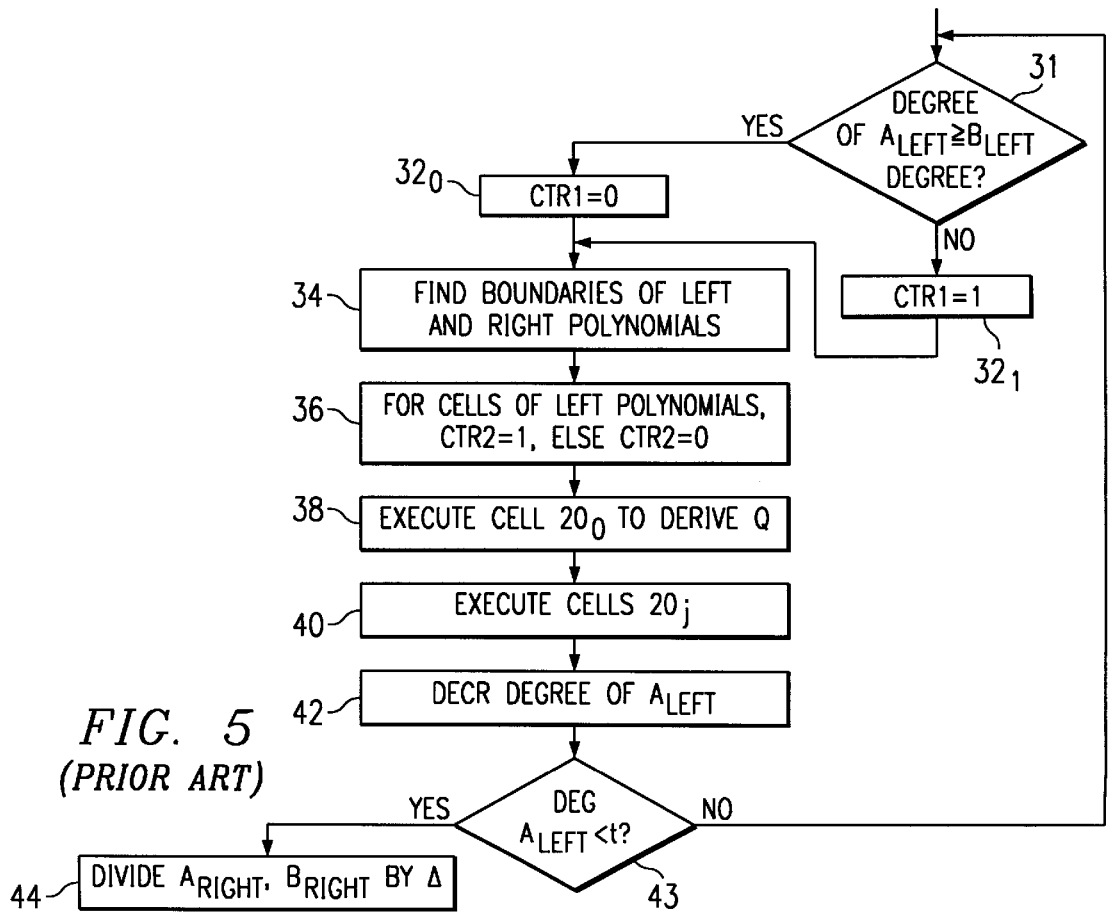
FIG. 5 is a flow diagram illustrating the operation of the conventional Reed-Solomon decoder architecture of FIG. 2.

Additionally, control signals are received on control bus C from program control and address generator 149, and stored in control register CREG to control the operation of Euclidean array unit 115. Euclidean array unit 115 according to this embodiment of the invention is utilized for sequentially performing the Euclidean processing of each of the respective bit positions of the A and B registers, by way of iterative passes through Euclidean array unit 115. For example, to perform the exemplary process of FIG. 5, where 2t+5 cells 20 were utilized according to conventional approaches, 2t+5 iterations of Euclidean array unit 115 of FIG. 7 will be performed for each instance of processes 38, 40; multiple passes through the iterations are then performed until the degree of polynomial $A_{left}$ is less than the number of possible errors t. Considering that Euclidean array unit 115 must therefore perform different operations depending upon whether it is operating as cell $20_0$ or as one of cells $20_j$ (j≠0), control register CREG includes $0^{th}$ CELL location for storing a control bit that is forwarded on line EN to indicate whether Euclidean array unit 115 is to operate as the zeroth cell or as one of the later cells. Additionally, control register CREG includes SWAP location for storing a control bit that determines the state of control line CTR1, and $\overline{L/R}$ location for storing a control bit that determines the state of control line CTR2. In this implementation, SWAP location of control register CREG is set if the A polynomial has a degree less than that of the B polynomial, and $\overline{L/R}$ location of control register CREG is set depending upon whether the cell upon which Euclidean array unit 115 is currently operating is in the left or right polynomial position, as discussed relative to process 36 of FIG. 5, and as will be described in further detail hereinbelow. Alternatively, control register CREG may have multiple bits constituting $\overline{LR}$ locations, one for each of the iterations required to execute one pass of Euclidean solution, with each $\overline{L/R}$ location indicating the state of control line CTR3 for its associated iteration. The states of these locations of control register CREG are set and reset by way of control signals on control bus C.

Source register SRC has at least two locations (e.g., of byte size), for storing A operand $A_n$ and B operand $B_n$; the A operand $A_n$ and the B operand $B_n$ are forwarded from source register SRC on lines A_input, B_input, respectively, to multiplexers 47, 49. Multiplexers 47, 49 are controlled by control line CTR1 according to the state of SWAP location of control register CREG. Lines A_input, B_input are received by opposite inputs of multiplexers 47, 49, so that multiplexers 47, 49 select different ones of the sets of lines A_input, B_input in either state of SWAP location of control register CREG. The output of multiplexer 47 is applied to Galois field divider 50, to multiplexer 51, and to Galois field adder 56. Similarly, the output of multiplexer 49 is applied to Galois field divider 50, to multiplexer 51, and to Galois field adder 58.

Galois field divider 50 receives an enable signal on line EN from $0^{th}$, CELL location of control register CREG, so as to be enabled when Euclidean array unit 115 is operating as the zeroth cell in the Euclidean array process. Galois field divider 50 is of conventional construction for performing Galois-type finite field division of the two operands received at its inputs i.e., either $A_0$ divided by $B_u$, or $B_0$ divided by $A_0$, depending on the state of SWAP location of control register CREG). Because the quantity $$\frac{A_0}{B_0}$$

may be considered as $A_0$ multiplied by $$\frac{1}{B_0},$$

Galois field divider 52 may include a 256-entry reciprocal look-up table, followed by a Galois field multiplier, to multiply one operand by the reciprocal of the other, and thus accomplish the division. The output of Galois field divider 52 is applied to Q register 52 (which is enabled to receive this result by the control signal on line EN); Q register 52 thus supplies a Q value on lines Q to Galois field multiplier 54 for use in later iterations of the operation of Euclidean array unit 115.

Multiplexer 51, as noted above, receives the selected outputs of multiplexers 47, 49 at its inputs, and selects one of these inputs responsive to the state of control line CTR1 for application to Galois field multiplier 54, for multiplication with the Q value stored in Q register 52. Through the operation of multiplexers 47, 49 in combination with multiplexer 51, the A operand on lines A_input will be forwarded to Galois field multiplier 54 in either state of SWAP location of control register CREG i.e., when multiplexer 47 selects lines A_input, multiplexer 51 selects multiplexer 47, and when multiplexer 49 selects lines A_input, multiplexer 51 selects multiplexer 49). Galois field multiplier 54 is of conventional construction for performing Galois-type finite field multiplication of the two operands received at its inputs, namely the A operand and the Q value. The output of Galois field multiplier 54 is applied to opposite inputs of multiplexers 53, 55.

Multiplexers 53, 55 each also receive a hard-wired zero value at their second inputs, and are each controlled by control line CTR2 as determined by L/R location of control register CREG. As such, one of multiplexers 53, 55 selects a zero value while the other selects the output of Galois field multiplier 54. The output of multiplexer 53 is applied to Galois filed adder 56 for addition with the output of multiplexer 47, while the output of multiplexers 55 is applied to Galois field adder 58 for addition with the output of multiplexer 49.

Galois field adders 56, 58, are each of conventional construction for performing Galois-type finite field addition of the two operands received at its inputs. The output of Galois field adder 56 corresponds to the A operand $A_{n+1}$ for use in the next iteration of Euclidean array unit 115, and is stored in the second location of result register RES. The output of Galois field adder 58, on the other hand, corresponds to the B operand $B_{n+1}$, and is stored in the first location of result register RES.

The contents of the first and second locations of result register RES are stored in RAM 144 at the locations $ADDR_k$, $ADDR_{k+1}$, respectively, from which the B and A operands $B_n$, $A_n$ were retrieved and stored in source register SRC. This switching of position of the result operands $A_{n+1}$, $B_{+1}$ when stored in result register RES causes the output B operand $B_{n+1}$ to be stored in the location of RAM 144 from which the A input operand $A_n$ was retrieved ($ADDR_{k+1}$), while the output A operand $A_{n+1}$ is stored in the location of RAM 144 from which the B_input operand was retrieved ($ADDR_k$). As will become apparent from the following description, this switching of the result operands permits the next pass through Euclidean array unit 115 to be executed without requiring the shifting of the entireties of the A and B registers in RAM 144.

Figure 8:
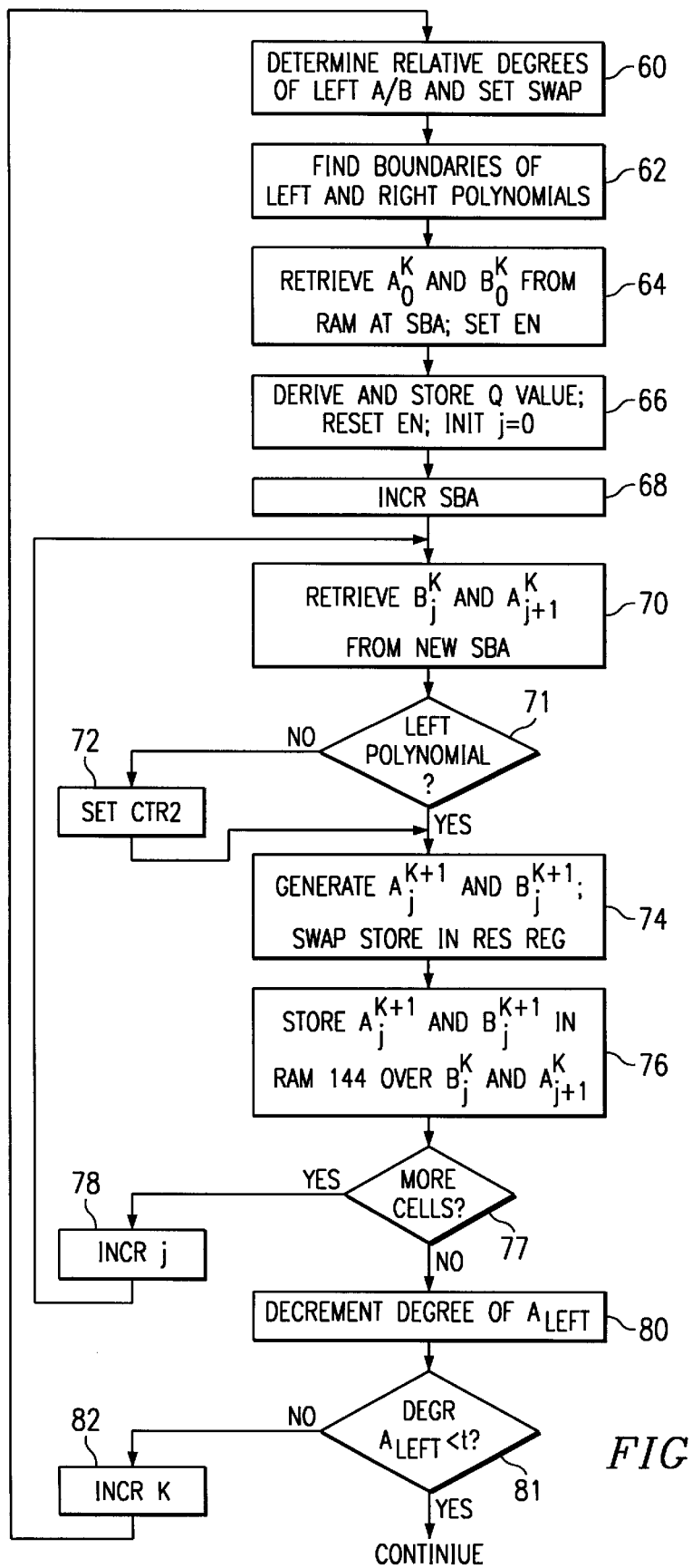
FIG. 8 is a flow diagram illustrating the operation of the Euclidean array unit of FIG. 7 according to the first embodiment of the invention.
Figure 9:
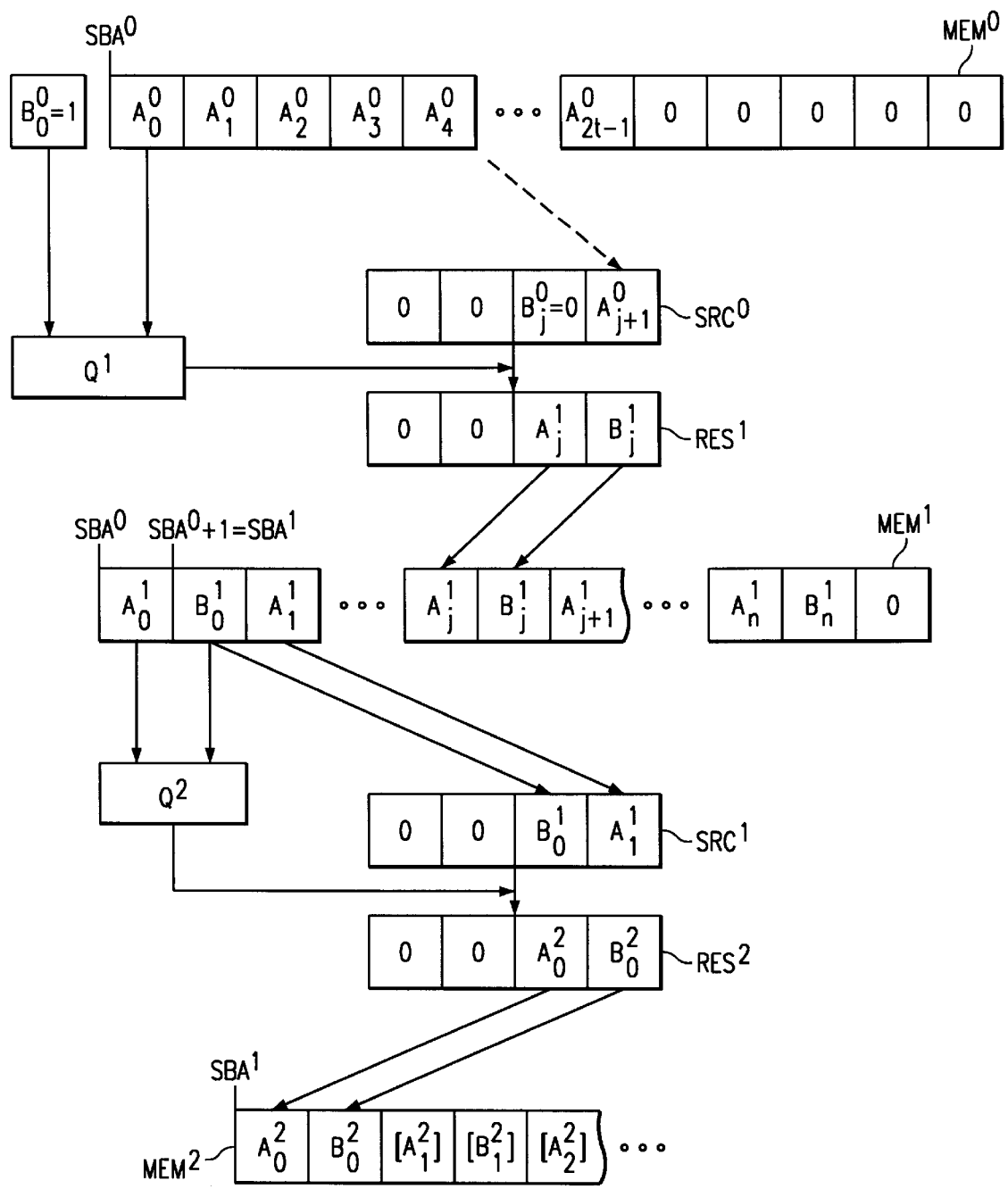
FIG. 9 is a dataflow diagram illustrating the contents of certain memory and register locations at certain stages in the operation of the Euclidean array unit of FIG. 7 according to the first embodiment of the invention, as illustrated in FIG. 8.

The operation of Euclidean array unit 115 of FIG. 7 according to this first preferred embodiment of the present invention will now be described relative to FIGS. 8 and 9. FIG. 8 is a flow diagram illustrating the operation of Euclidean array unit 115, while FIG. 9 illustrates the dataflow of this operation relative to RAM 114, source register SRC, and result register RES. This operation is contemplated to be in response to a specific instruction in the instruction set of DSP 130, given that Euclidean array unit 115 is a functional unit therewithin. In this implementation of DSP 130, such an instruction will be decoded and executed under the control of program controller and address generator circuitry 149. An exemplary instruction format for the Euclidean operation instruction is as follows:

| Main opcode | misc. control bits | SRC register number | CREG register number | RES register number |
|---|---|---|---|---|

The main opcode of this instruction is, of course, the sequence of bits that indicates that this instruction is the Euclidean operation; miscellaneous control bits are provided as consistent with the architecture of DSP 130 and its instruction set. As indicated above, source register SRC, control register CREG, and result register RES are selected ones of general-purpose registers 148 within DSP 130, and as such are specified by the instruction itself. Alternatively, source register SRC, control register CREG, and result register RES (or any combination thereof) may be realized as fixed registers within Euclidean array unit 115 or elsewhere within DSP 130, in which case arguments for the selection of the registers would not be necessary in the Euclidean operation instruction. Memory operations are performed outside of the particular instruction, for example under the control of data registers and address generator 148 and memory/peripheral interface 145; additionally, the determination of whether the instruction is executing the first iteration (zeroth cell) or later iterations is determined by the contents of control register CREG, specifically by setting and resetting the state of the $0^{th}$, CELL location therein.

Referring now to FIG. 8 in combination with FIG. 9, the method of operation of Euclidean array unit 115 according to this first embodiment of the present invention will now be described. For purposes of this description, the term "iteration" or "cell" refers to operations upon individual A and B operand values within the sequences, while the term "pass" will refer to one set of iterations associated with one division executed by the Euclidean process of this embodiment of the invention.

Figure 4A:
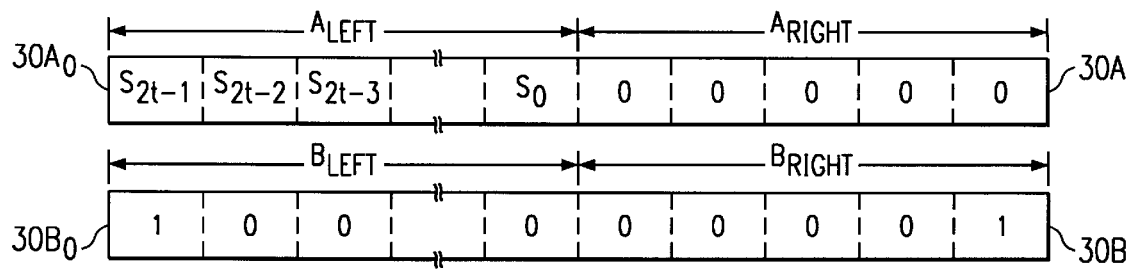
FIGS. 4a and 4b are diagrams illustrating the contents of A and B operand registers at the beginning and end, respectively, of execution by the Euclidean array function of the conventional Reed-Solomon decoder architecture of FIG. 2.
Figure 4B:
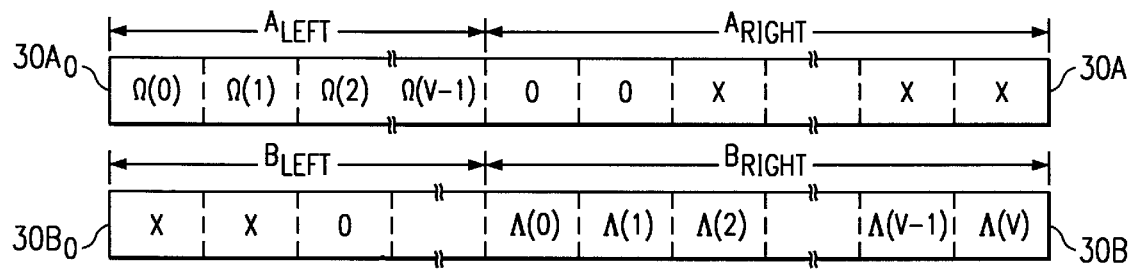

At the initiation of this process, as described above relative to FIG. 4a, the syndrome coefficients are contained within a left-hand polynomial $A_{left}$, while the right-hand polynomial $A_{right}$ is simply five bytes of zero, in this example. The initial values of the B operands are presented as left ($B_{left}$) and right ($B_{right}$) polynomials with leading and trailing "1" values, respectively. According to the preferred embodiment of the invention, since the B polynomials are explicitly set prior to initiation of the process, memory region $MEM^0$ (the superscript $^0$ indicating the first pass through the process) contains the sequence of coefficients corresponding to the A operand, namely values $A_0^0$, $A_1^0$, $A_2^0$, ... $A_{2t-1}^0$ (the subscript indicating the position of the A value in the sequence). These coefficients are stored in memory location $MEM^0$ at an address beginning with starting byte address $SBA^0$.

In process 60, the general purpose logic of DSP 130 first determines the relative degree of the left polynomials $A_{left}$, $B_{left}$, and sets SWAP location in control register CREG accordingly; the state of SWAP location determines the state of control line CTR1 in Euclidean array unit 115, as described above. In process 62, the general-purpose logic of DSP 130 next determines the location of the left and right A polynomial boundary (i.e., the location in the coefficient sequence at which polynomial $A_{left}$ ends and polynomial $A_{right}$ begins). This boundary determines the iterations for which control line CTR2 will be set or not set, as discussed above and as will be discussed in further detail below. The B polynomial boundary is in the same location as that for the A operand.

Process 64 next is executed by DSP 130 to retrieve the first operands from RAM 144 for storage into source register SRC (which is indicated by the instruction opcode, as noted above). As illustrated in FIG. 9, this retrieval retrieves the first A operand value $A_0^0$ from starting byte address SBA of memory region $MEM^0$. The first B operand value $B_0^0$ is set to one, as noted above, and as such need not be retrieved from memory but may instead be an explicit value. In this first iteration, or zeroth cell, process 64 also sets $0_{th}$ CELL location of control register CREG to indicate that the ensuing operation of Euclidean array unit 115 will be generating the Q value, and that therefore Euclidean array unit 115 should set its control line EN to enable Galois field divider 50 and Q register 52.

In process 66, Euclidean array unit 115 is then operated with control line EN set, so that Galois field divider 50 generates the first Q value $Q^1$ and stores this value in Q register 52. Also as a result of process 66, the index j which refers to the byte position within the A and B operands upon which processing is currently being carried out, and which thus is an index of the iteration being carried out by Euclidean array unit 115, is initialized to zero, consistent with the current identification of the zeroth iteration. Process 66 also then resets $0^{th}$ CELL location in control register CREG, so that control line EN is inactive for the remaining iterations.

Process 68 next increments the starting byte address SBA, for all passes except the first, zeroth pass (k=0). According to this embodiment of the invention, as will be described in further detail hereinbelow, the swapping of the A and B operand results in result register RES, in combination with the incrementing of the starting byte address SBA in process 68, eliminates the need to shift the large A and B operands in memory in order to accomplish the Euclidean process.

Process 70 is then next carried out to retrieve the B and A values to be used in the ensuing jth iteration of the process. In the general case, both of the A and B input values $A_{j+1}^k$, $B_j^k$ are retrieved, with the A operand $A_{j+1}^k$ stored in the least significant byte of source register SRC. In the initial pass (k=0) through the process of FIG. 8, each B operand value is known; specifically, $B_0^0$ and $B_{2t+4}^0$ are both ones, while all other B operand values $B_j^0$ are zero. As such, only the A operand value $A_{j+1}^0$ currently stored in memory but relative to the next value position (j+1) is retrieved from RAM 144 in each iteration through this first pass (k=0). The result of this retrieval, in the k=0 pass, is illustrated by source register instance $SRC^0$ of FIG. 9. Decision 71 determines whether the current operand values $A_{j+1}^0$, $B_j^0$ are in the left or right polynomials (based upon the result of process 62). If not (decision 71 is NO), $\overline{L/R}$ location of control register CREG is set in process 72, so that control line CTR2 is activated; conversely, if decision 71 is YES, $\overline{L/R}$ location is not set, and control line CTR2 is not activated.

In process 74, DSP 130 executes another instance of the Euclidean instruction, in this case with $0^{th}$ CELL location of control register CREG not set. Accordingly, referring back to FIG. 7, Galois field multiplier 54 and Galois field adders 56, 58 of Euclidean array unit 115 are activated to perform their respective finite field operations, resulting in two new A and B operand result values, namely, $A_j^{k+1}$, $B_j^{k+1}$. In the example of the first iteration (j=0) of the first pass (k=0), the values $A_0^1$, $B_0^1$ are generated. As described above relative to FIG. 7, these result values $A_j^{k+1}$, $B_j^{k+1}$ are stored in result register RES (indicated in the instruction itself), but in reverse order, such that the result value $B_j^{k+t}$ is stored in the least significant byte and then the result value $A_j^{k+1}$ in the next byte. Referring to FIG. 9, the result of process 74 is illustrated relative to result register instance $RES^1$, which has the values $A_j^1$, $B_j^1$ present, with result value $B_j^1$ in the least significant portion, swapping position of the A and B operands relative to the contents of source register $SRC^0$.

Process 76 is then performed to write the contents of result register RES to RAM 144 in the locations at which the input operands $A_{j+1}^k$, $B_j^k$ were previously stored. In the general case (k≠0), the result value $A_j^{k+1}$ will be stored in the location from which the input value $B_j^k$ was retrieved, while the result value $B_j^{k+1}$ will be stored in the memory location from which the input value $A_{j+1}^k$ was retrieved. In the first, zeroth, pass (k=0), provision will be made in the writing of the A and B operand results to not overwrite the next values of the A operand that will be required to complete this pass (for example, the interleaved result values may be stored in a different memory location than that of the input values $A_j^0$. Following the completion of storage process 76, DSP 130 executes decision 77 to determine whether more cells, or iterations, remain for the current pass through the Euclidean process. Specifically, decision 77 determines whether the current value of the index j exceeds the number of A and B operand values (i.e., 2t+5). If additional iterations remain (decision 77 is YES), the iteration index j is incremented in process 78 and the process continues from process 70. If all iterations for the current pass are complete (decision 77 is NO), then control passes to process 80.

FIG. 9 illustrates, relative to memory region $MEM^1$, the results of the first (k=0) pass through the process of FIG. 8, upon completion of the last iteration (decision 77 is NO). As illustrated in FIG. 9, the output results of the A and B operands are interleaved, with the A values for a given iteration leading the B values. Output value $A_0^1$ is stored at starting byte address $SBA^0$, with output value $B_0^1$ in the next location, followed by $A_1^1$, $B_1^1$, and so on.

Alternatively, the result values may be stored in a different memory location from that at which the input operands are stored, so that the results do not overwrite the source operands. In such a case, two starting byte addresses may be maintained, one for the operand source and the other for the result destination. In either case, the starting byte address (for source and for destination) need only be incremented from pass-to-pass, as appropriate.

In process 80, DSP 130 decrements the degree of the left polynomial $A_{left}$, considering that one polynomial division has been effected by way of the completed pass through the process. The decremented degree of left polynomial $A_{left}$ is then compared against the number t of correctable errors for the particular codeblock. If the degree of left polynomial $A_{left}$ is still greater than or equal to t (decision 81 is NO), process 82 is then performed to increment pass index k, and control passes to process 60, from which the next Euclidean division begins.

Referring to FIG. 9 again, memory portion $MEM^1$ includes the zeroth A operand input value $A_0^1$, stored at starting byte address $SBA^0$, with the zeroth B operand input value $B_0^1$ in the next location ($SBA^0$+1). In the second (k=1) pass of the process, zeroth A operand input value $A_0^1$ is used solely in the calculation of the Q value, and need not be retained thereafter. According to the preferred embodiment of the invention, therefore, the position of zeroth B operand input value $B_0^1$ becomes the new starting byte address SBA1 after SBA-incrementing process 68 is executed, such that the operands for each iteration of the second pass (k=1) are retrieved from memory in pairs ($B_0^1$, $A_1^1$), ($B_1^1$, $A_2^1$), and so on. For example, the result of the first iteration (j=0) of process 70 (i.e., after Q value $Q^2$ is generated) is illustrated in FIG. 9 relative to source register instance $SRC^1$, which contains operands $B_0^1$, $A_1^1$ therein, with operand $A_1^1$ in the least significant portion thereof. After this iteration (j=0), result register instance $RES^2$ contains results $A_0^2$, $B_0^2$, with operand $B_0^2$ in the least significant portion thereof, so that storage of the results can begin at starting byte address $SBA^1$ with operands $A_0^2$, $B_0^2$, and so on, as shown in FIG. 9.

Referring back to FIG. 8, upon determining that the decremented degree of left polynomial $A_{left}$ is less than correctable error number t (decision 81 is YES), the Euclidean process is complete. Additional processing, such as the normalization of the $A_{right}$ and $B_{right}$ polynomial coefficients, as described above relative to process 44 in FIG. 5, may then be carried out if desired.

According to the preferred embodiment of the invention, as described hereinabove, the relatively complex finite field arithmetic required in the Euclidean process may be efficiently performed by a programmable microprocessor, such as a digital signal processor (DSP) or general purpose microprocessor. Additionally, the ability to process each division by simply incrementing the starting byte address in memory of the interleaved operands provides further efficiency in the Euclidean operation, as the shifting of the long A and B operands in memory is avoided. Accordingly, it is contemplated that the use of Euclidean array unit 115 according to this embodiment of the present invention will provide important performance improvement in Reed-Solomon decoding as carried out by a general-purpose processor.

Figure 10:
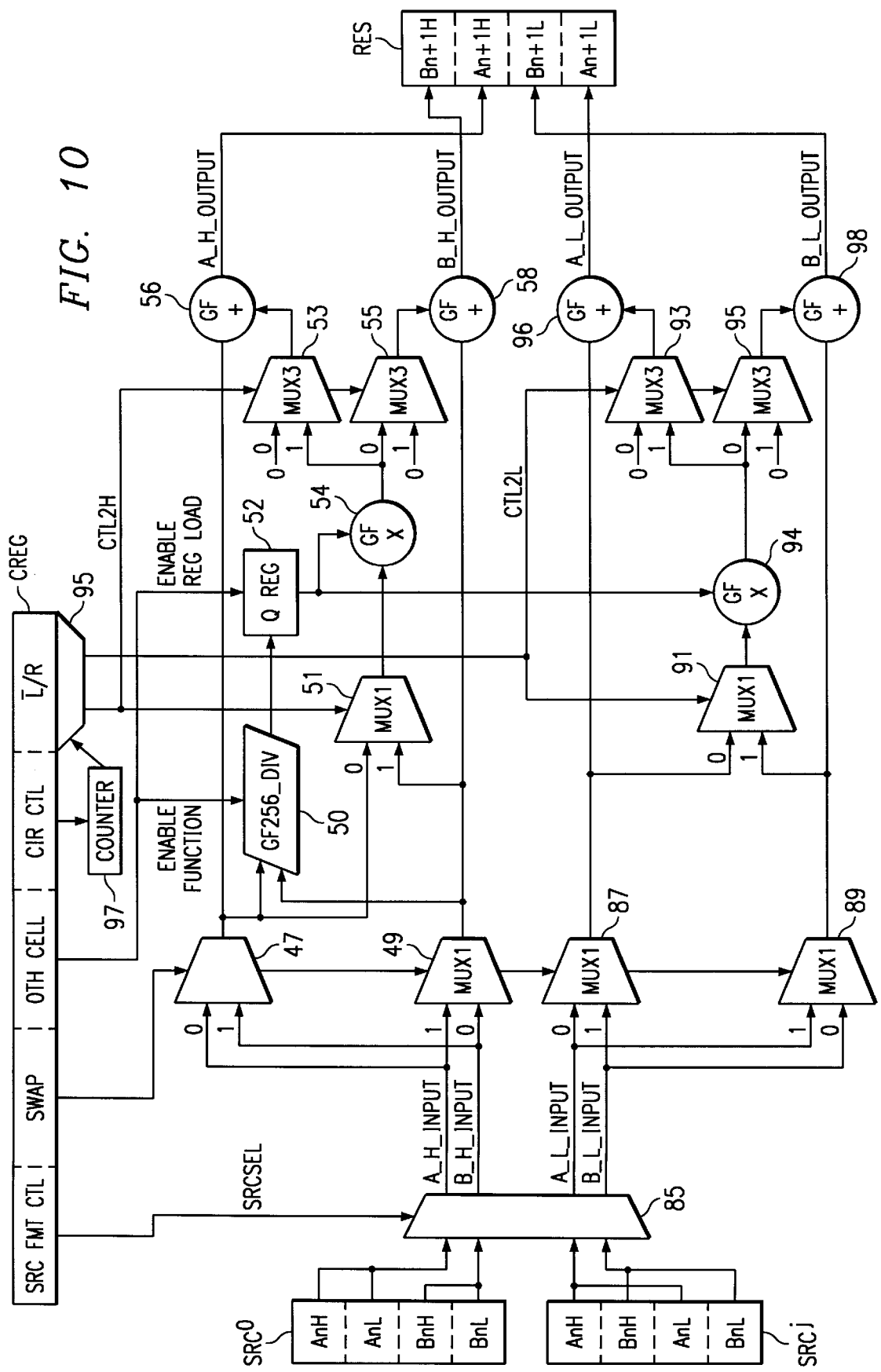
FIG. 10 is an electrical diagram, in block form, of a Euclidean array unit according to a second preferred embodiment of the invention.

Referring now to FIG. 10, the construction of Euclidean array unit 115' according to a second embodiment of the present invention will now be described in detail. Euclidean array unit 115' in this embodiment of the invention is arranged in a Single Instruction Multiple Data (SIMD) format, such that a single Euclidean function instruction can effect multiple Euclidean divisions. Additionally, according to this second embodiment of the invention, different source registers $SRC^0$, SRC are used to present input operands A, B to Euclidean array unit 115', depending upon whether the zeroth (k=0) pass or $k^{th}$ (k≠0) pass is being executed, considering that the A operands are in sequence in memory for the zeroth (k=0) pass, but that the A and B operands are interleaved after the zeroth (k=0) pass is complete and the A and B results have been written to RAM 144 at least once.

As illustrated in FIG. 10, source registers $SRC^0$, $SRC^j$ have their outputs presented to source multiplexer 85 of Euclidean array unit 115'. Each of source registers $SRC^0$, $SRC^j$ include four byte positions; source register $SRC^0$ stores four operand bytes in AnH, AnL, BnH, BnL sequence (with low and high order indicators L, H), while source register $SRC^j$ stores the four operand bytes in AnH, BnH, AnL, BnL interleaved sequence. Source multiplexer 85 receives a control signal on line SRCSEL from control register CREG; control register CREG includes SRC FMT CTL location which indicates whether the zeroth (k=0) pass or subsequent (k>0) pass is being executed by Euclidean array unit 115', thus controlling which of source registers $SRC^0$, $SRC^j$ is to be used as the source of the operands (i.e., non-interleaved or interleaved).

Euclidean array unit 115' includes the components of Euclidean array unit 115 described hereinabove, such components being referred to by the same reference numerals, and utilized for operating upon the high order A and B operands, as illustrated in FIG. 10. According to this embodiment of the invention, however, lower order A and B operands (lower order meaning having a higher "j" index value) are simultaneously processed, by way of multiplexers 87, 89, 91, 93, 95, Galois field multiplier 94, and Galois field adders 96, 98. According to this embodiment of the invention, multiplexers 87, 89 are controlled by control line CTR1 according to the state of SWAP location of control register CREG. Lines A__L__input, B__L__input are received by opposite inputs of multiplexers 87, 89, so that multiplexers 87, 89 forward opposing operands to Galois field adders 96, 98, similarly as in Euclidean array unit 115 described hereinabove. Multiplexer 91, similarly as multiplexer 51 described above, receives the selected outputs of multiplexers 87, 89 at its inputs, and selects one of these inputs responsive to the state of control line CTR1 for application to Galois field multiplier 94, for multiplication with the Q value stored in Q register 52. Through the operation of multiplexers 87, 89 in combination with multiplexer 91, the A operand on lines A__L__input will be forwarded to Galois field multiplier 94 in either state of SWAP location. Galois field multiplier 94 is of conventional construction for performing Galois-type finite field multiplication of the two operands received at its inputs, namely the lower order A operand and the Q value. The output of Galois field multiplier 94 is applied to opposite inputs of multiplexers 93, 95, each of which also receive a hard-wired zero value at their second inputs, and are each controlled by control line CTR2L. The output of multiplexer 93 is applied to Galois field adder 96 for addition with the output of multiplexer 87, while the output of multiplexer 95 is applied to Galois field adder 98 for addition with the output of multiplexer 89.

According to this embodiment of the invention, $\overline{L}/R$ location of control register CREG includes indications of the location of the left and right polynomial boundaries, in the form of a bit for each byte position in the A and B registers. Counter control portion of control register CREG controls counter 97, which is advanced upon each iteration through the Euclidean division. Counter 97 controls a multiplexer 95 that controls control lines CTL2H and CTL2L according to the current locations of $\overline{L}/R$ location of control register CREG. According to this embodiment of the invention, therefore, the process of locating the left and right polynomial boundaries need only be performed once per pass, thus eliminating a repetitive process from the overall Euclidean method and further improving the efficiency of this process. Separate control lines CTL2H and CTL2L are provided in Euclidean array unit 115', to provide for the case where the left and right polynomial boundary fall between the lower and higher order A and B operands being processed (such an occurrence having approximately an even chance of happening). In this embodiment of the invention, control line CTL2H controls multiplexers 53, 55, while control line CTL2L controls multiplexers 93, 95.

Galois field adders 96, 98, as before, are each of conventional construction for performing Galois-type finite field addition of the two operands received at its inputs. The output of Galois field adder 56 corresponds to the lower order A operand and is stored in the fourth byte location of result register RES, while the output of Galois field adder 58, on the other hand, corresponds to the lower order B operand and is stored in the third location of result register RES. The higher order B operand is stored in the least significant (first) byte location of result register RES, while the higher order A operand is stored in the second byte location of result register RES. As is therefore evident from FIG. 10, Euclidean array unit 115' according to this embodiment of the invention similarly swaps the register positions of the A, B operand from their input order to their output order. Accordingly, simple incrementing of the starting byte address SBA will accomplish the necessary shift required for the Euclidean operation from pass to pass.

The operation of Euclidean array unit 115' according to this second embodiment of the present invention is substantially similar as that described hereinabove relative to FIGS. 8 and 9, with a few exceptions that will now be described. As noted above, the left and right polynomial boundary is derived once, and a code stored in $\overline{L}/R$ location of control register CREG, based upon which counter 97 determines the state of control lines CTR2H, CTR2L depending upon the iteration being executed. Secondly, source register multiplex 85 is provided for use in presenting either non-interleaved (first pass, or k=0) or interleaved (subsequent passes, or k≠0) arrangements of the A and B operands. Further, as is evident from the construction of Euclidean array unit 115' illustrated in FIG. 10, two results are generated per execution cycle of Euclidean array unit 115', which further improves the efficiency of the Euclidean array process. For example, using a correctable error number t of ten, the Euclidean array process may be executed in approximately 300 cycles, considering forty-eight Q value calculations, plus 480 iterations through Euclidean array unit 115'. This number of cycles is greatly less than the 7128 cycles which would be required if the Euclidean operation, particularly the finite field arithmetic operations, were executed by general-purpose arithmetic and logic circuitry in a microprocessor. It is therefore contemplated that the efficiency of the Euclidean array process is greatly improved by the present invention, especially using the SIMD architecture described herein relative to FIG. 10.

Figure 11:
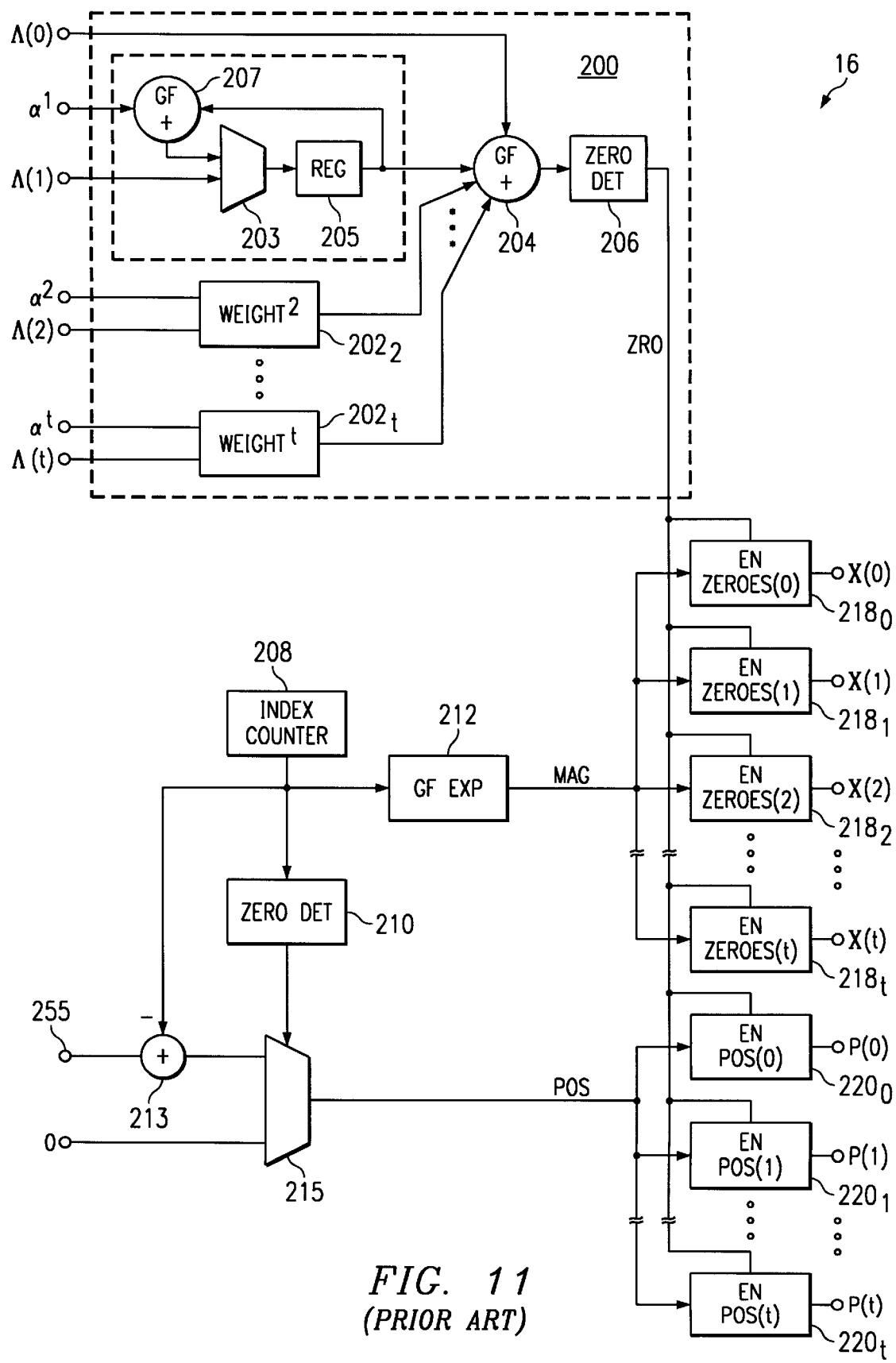
FIG. 11 is an electrical diagram, in block form, of a conventional Chien search unit.
Figure 12:
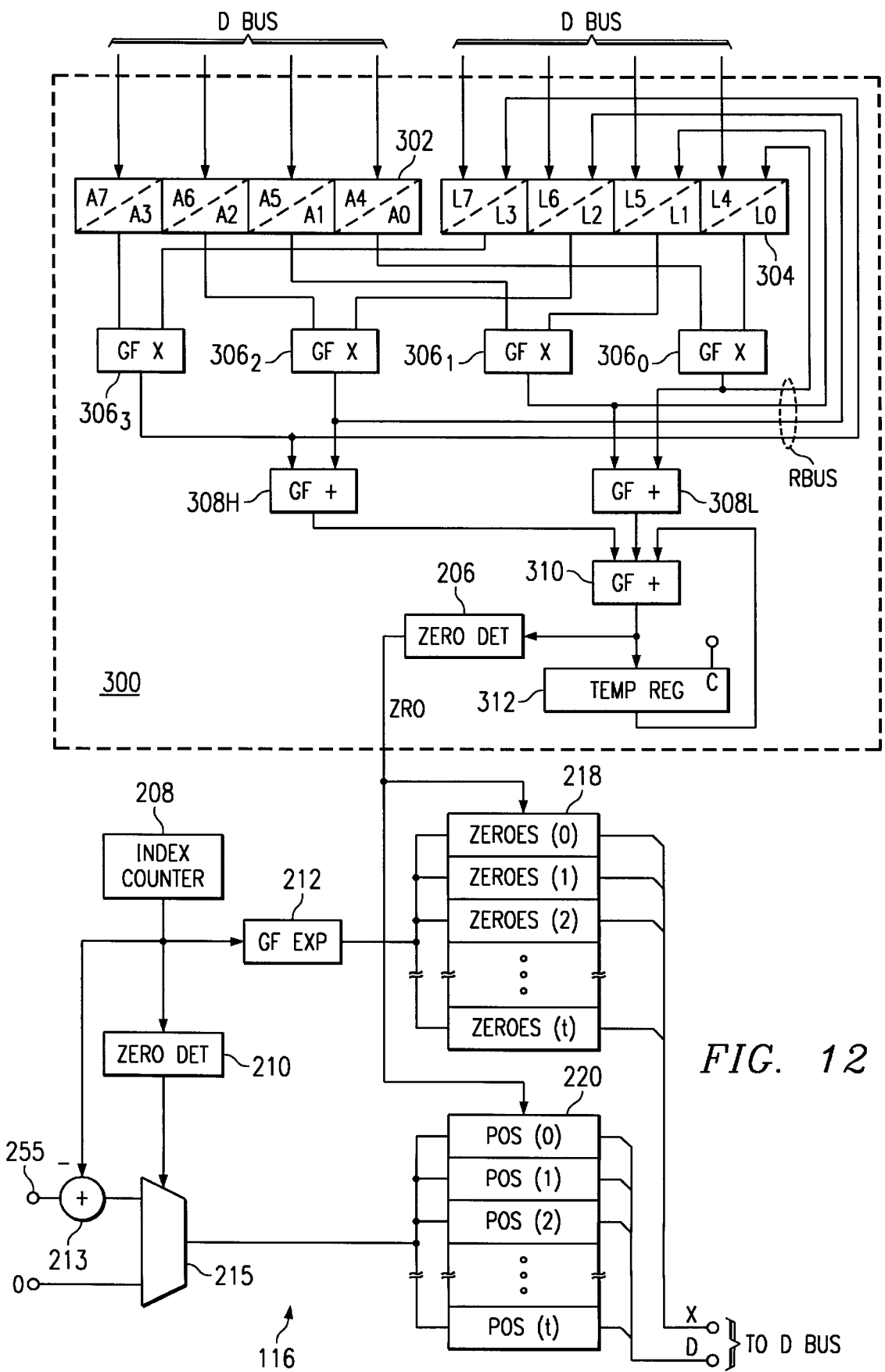
FIG. 12 is an electrical diagram, in block form, of a Chien search unit according to a first preferred embodiment of the invention.

Referring now to FIG. 12, the construction of Chien search unit 116, as suitable for use in DSP 130, according to a first preferred embodiment of the invention will now be described. Similar elements as described above relative to FIG. 11 are referred to by the same reference numerals, such elements including index counter 208, zero detection circuit 210, Galois field exponential circuit 212, Galois field adder 213, multiplexer 215, and registers 218, 220. In this embodiment of the invention, the contents of zeroes register 218 are presented as X values, and the contents of position register 220 are presented as P values, onto bus D for storage in RAM 144 by way of execution of a store instruction.

In this embodiment of the invention, Chien search unit 116 includes root detection circuit 300, which is particularly well-suited for use in the implementation of Chien search unit 116 as an execution unit in a programmable logic device, such as DSP 130. In this example, the number t of correctable errors per codeword is eight, and the finite field arithmetic corresponds to Galois field 256. Root detection circuit 300 includes two registers 302, 304, each of which have eight interleaved byte locations in this example. Register 302 includes byte locations A0 through A7 while register 304 includes byte locations L0 through L7. The byte locations in each of registers 302, 304 are interleaved and selectable for input and output in pairs, such that according to a first selection state, byte locations A0 through A3 of register 302 and byte locations L0 through L3 of register 304 are selected for input or output, and in a second selection state, byte locations A4 through A7 of register 302 and byte locations L4 through L7 of register 304 are selected. Each of registers 302, 304 receives data from bus D of DSP 130. Specifically, responsive to load instructions, register 302 stores symbols $\alpha^0$ through $\alpha^7$, fetched from RAM 144 over bus D in its locations A1 through A7, respectively, while register 304 stores $\Lambda(0)$ through $\Lambda(7)$ values in its locations L0 through L7, respectively. As will also be described below, register 304 is also operable to store the contents of feedback values presented thereto on bus RBUS.

The contents of registers 302, 304 are presented in paired byte-by-byte fashion to Galois field multipliers 306. In this embodiment of the invention, and in one selection state, Galois field multiplier $306_0$ receives its inputs from location L0 of register 304 and location A0 of register 302, Galois field multiplier $306_1$ receives its inputs from locations L1, A1 of registers 304, 302, respectively, and so on for Galois field multipliers $306_2$, $306_3$. In a second selection state, Galois field multiplier $306_0$ receives its inputs from location L4 of register 304 and location A4 of register 302, Galois field multiplier $306_1$ receives its inputs from locations L5, A5 of registers 304, 302, respectively, and so on for Galois field multipliers $306_2$, $306_3$. Accordingly, Galois field multipliers 306 each perform a Galois field type finite field multiplication upon the contents of associated locations of registers 302, 304. The outputs of Galois field multipliers $306_3$, $306_2$ are forwarded to Galois field adder 308H, while the outputs of Galois field multipliers $306_1$, $306_0$ are forwarded to Galois field adder 308L. Additionally, each of the outputs of Galois field multipliers 306 are also forwarded to register 304 over bus RBUS, for storage of the multiplication result back into register 304. For example, after byte-by-byte multiplication of locations A0 through A3 with locations L0 through L3, the output of Galois field multiplier $306_3$ is stored in byte location $L_3$ of register 304, the output of Galois field multiplier $306_2$ is stored in byte location $L_2$ of register 304, and so on. Accordingly, the result of the finite field multiplication by Galois field multipliers 306 are both forwarded for use in root detection, and also saved for a later iteration.

The outputs of Galois field adders 308H, 308L are forwarded to Galois field adder 310, the output of which is forwarded to temporary register 312 according to this embodiment of the invention. Additionally, the output of Galois field adder 310 also corresponds to a final result that is applied to zero detection circuit 206. Zero detection 206 generates an output signal on line ZRO that indicates, when active, that the result of the addition performed by Galois field adder 310 is zero, and that therefore a root of the current polynomial upon which Chien search unit 116 is operating has been found. Line ZRO is applied to the enable input of registers 218, 220, to effect storage of the output of exponential circuit 212 and the remainder generated by adder 213, respectively, under the control of index counter 208, zero detection circuit 210, and multiplexer 215, as described above relative to FIG. 11.

Figure 13:
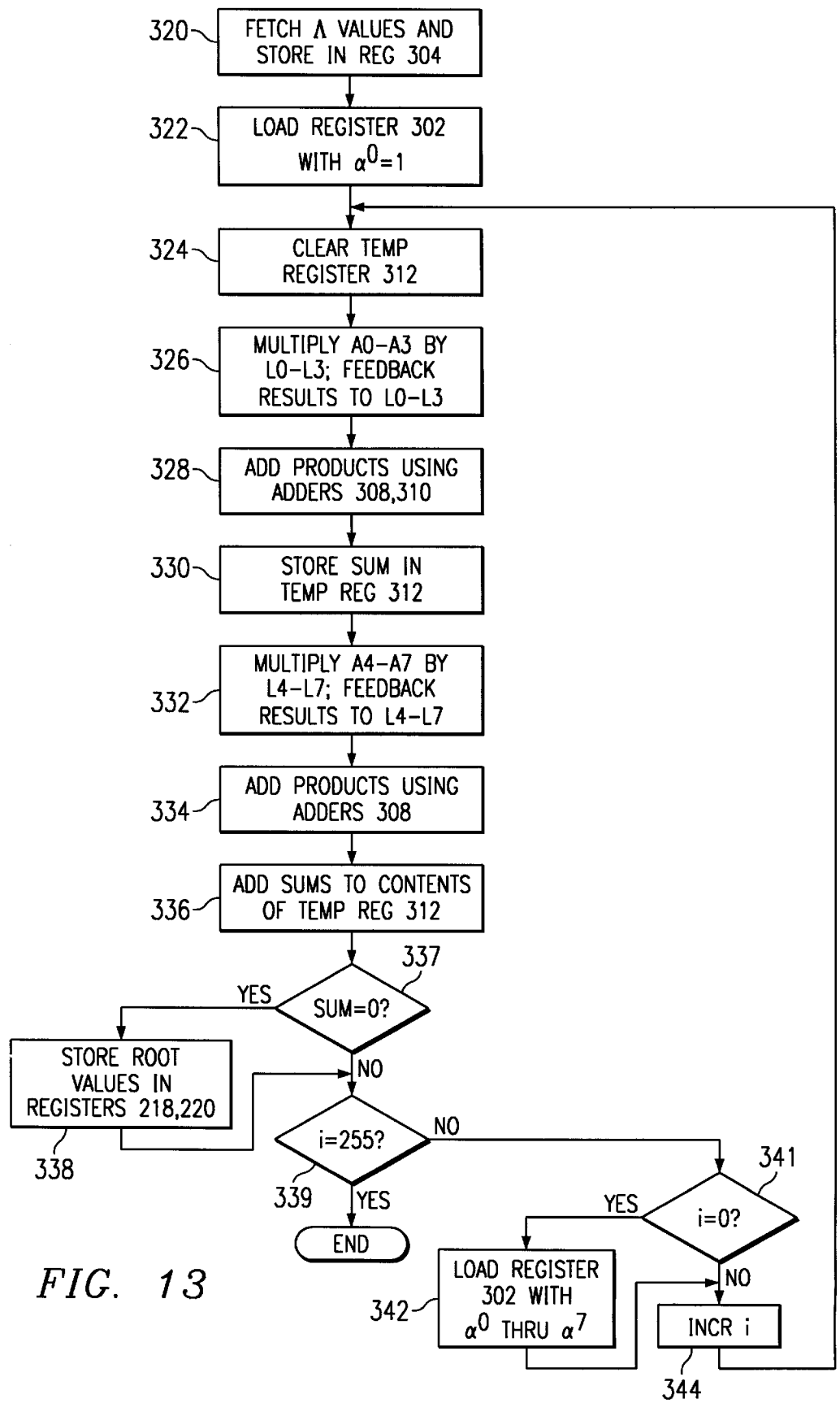
FIG. 13 is a flow chart illustrating the operation of the Chien search unit of FIG. 12 according to the first preferred embodiment of the invention.

The operation of Chien search unit 116 according to this embodiment of the invention, in executing a Chien search reduction operation will now be described relative to FIGS. 12 and 13 in combination. FIG. 13 is a flow diagram illustrating this operation. As in the case of the Euclidean array operation, the Chien search operation of FIG. 13 is intended to be executed in response to an instruction code that is received, decoded, and executed under the control of program controller and address generator circuitry 149 of DSP 130. In this manner, the system user of DSP 130 will be readily able to include the Chien search operation within program code, such as may be especially useful in Reed-Solomon decoding of received bitstreams.

The execution of the Chien search operation, in response to receipt and decoding of a corresponding instruction code as noted above, begins with process 320, in which the $\Lambda(0)$ through $\Lambda(7)$ values are fetched from memory, such as RAM 144 or a source register identified in the instruction, and stored in register 304. In process 322, the initial $\alpha^0$ values (which are necessarily unity) are loaded into each of the byte locations of register 302. At this point, an index i is set to 1, indicating that the zeroth symbol in the Galois field symbol alphabet (and, in the evaluation of the polynomial, the trivial case) is to be analyzed. In process 324, the contents of temporary register 312 are cleared. Also at this point, index counter 208 (which maintains the index i, if desired) is reset to the index value of 1.

The root detection operation then begins with the execution of process 326, in which Galois field multipliers $306_0$ through $306_3$ each execute a finite field multiplication of the contents of the lower order byte locations of registers 302, 304, namely multiplying the contents of byte locations A0, L0; A1, L1; A2, L2, and A3, L3. The results of these multiplications are fed back to register 304 over return bus RBUS, for storage in byte locations L0 through L3, respectively. As indicated in FIG. 12 and as described above, these products are also forwarded to adders 308H, 308L for Galois field addition, the outputs of which are forwarded to Galois field adder 310 for addition (with the contents of temporary register 312, which was cleared in process 324). The result from Galois field adder 310 is then stored in temporary register 312, in process 330. Zero detection circuit 206 performs no zero detection at this point, as this is the addition necessary for root detection is only half-complete.

In process 332, Galois field multipliers $306_0$ through $306_3$ next receive and multiply the contents of the higher order byte locations of registers 302, 304; specifically, multiplying the contents of byte locations A4, L4; A5, L5; A6, L6, and A7, L7. These products are fed back to register 304, specifically to byte locations L4 through L7 of register 304 (byte locations L0 through L3 having already been loaded with their feedback values). In process 334, Galois field adders 308H, 308L then add the products generated by Galois field multipliers $306_0$ through $306_3$. These sums are then added, along with the current contents of temporary register 312, by Galois field adder 310 in process 336; the resulting complete sum is then presented to zero detection circuit 206, which executes decision 337 to determine if the sum is zero (i.e., if a root has been found). If so (decision 337 is YES), line ZRO is activated by zero detection circuit 306, and the appropriate values are stored in registers 218, 220 in process 338. In either case (upon completion of process 338 or if decision 337 is NO), decision 339 is then performed (for example by zero detection circuit 210) to determine if the index value i is equal to 255; if so (decision 339 is YES), the entire Galois field symbol alphabet has been analyzed, and the process may end.

If additional members of the Galois field symbol alphabet remain to be analyzed (decision 339 is NO), decision 341 is then performed to determine whether the first pass was that which was most recently completed, primarily to determine if the proper α values are present in register 302. If the first pass was most recently completed (decision 341 is YES), process 342 is performed, by way of which byte locations A0 through A7 of register 302 are loaded with the appropriate values of the powers of symbol α (i.e., $\alpha^0$ through $\alpha^7$, respectively). If the most recent pass was not the first (decision 341 is NO), or upon completion of process 342, register 302 now contains the appropriate power values of symbol α, index i is incremented in process 344, and control passes back to process 324, to repeat the root detection process from that point forward.

According to the preferred embodiment of the invention, DSP 130 is able to efficiently perform Chien search reduction operations, through use of Chien search execution unit 116 in carrying out the process of FIG. 13. For example, it will be readily seen that each pass performed by root detection unit 300 requires one clock cycle for clearing the temporary register, followed by two sets of parallel Galois field multiplications and two five-input Galois field additions. Significant efficiency in the execution of the Chien search operation can thus be readily obtained.

Figure 14:
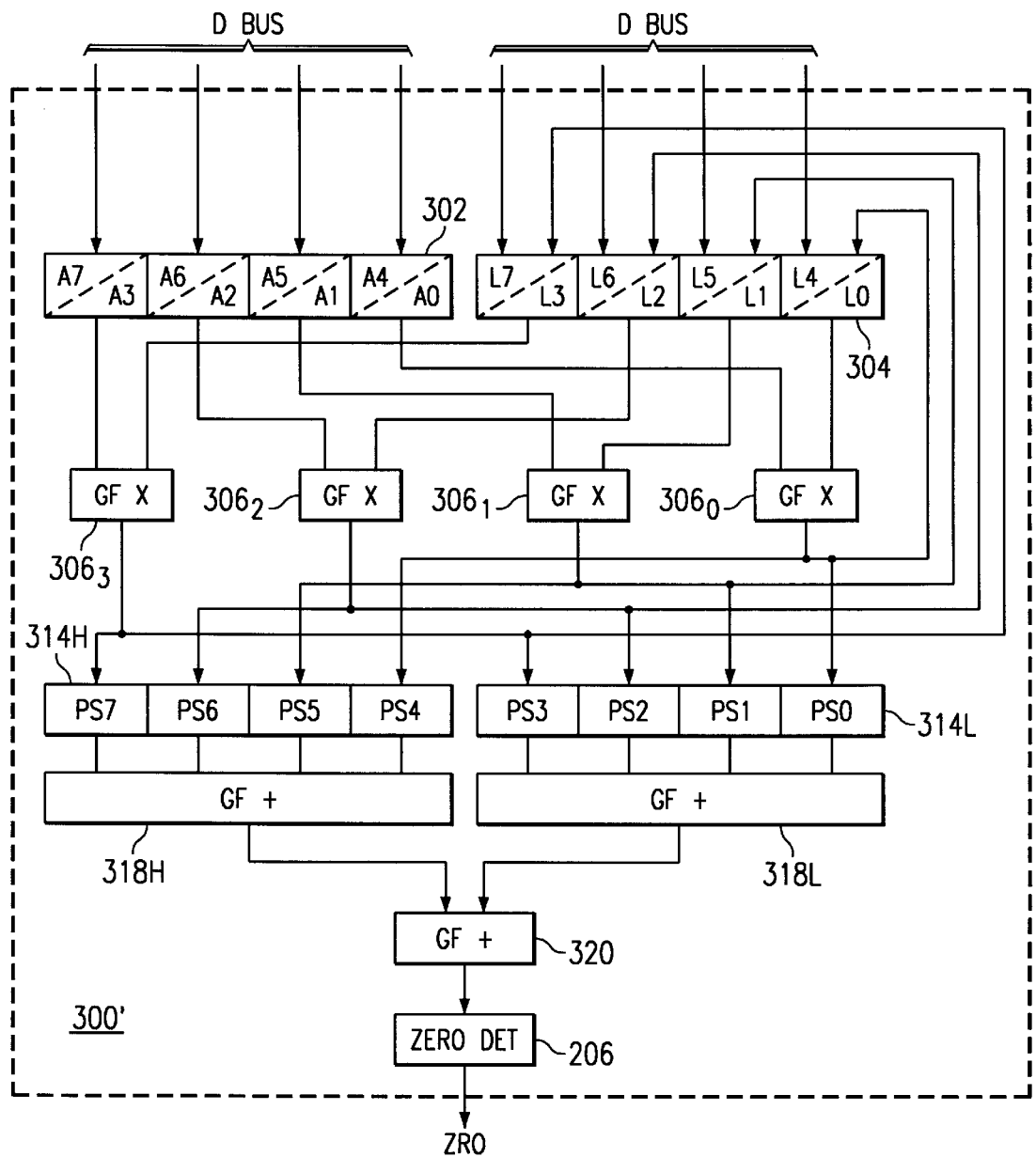
FIG. 14 is an electrical diagram, in block form, of a Chien search unit according to a second preferred embodiment of the invention.

Referring now to FIG. 14, root detection unit 300' according to a second embodiment of the present invention will now be described, in which similar components are referred to by the same reference numeral as used in FIG. 12. Specifically, registers 302, 304, and Galois field multipliers 306 are constructed, interconnected, and operate the same as in root detection unit 300 described hereinabove.

According to this second embodiment of the present invention, however, the outputs of Galois field multiplies 306 are not only fed back on bus RBUS to register 304, but are also forwarded to selective ones of partial product registers 314H, 314L. Partial product register 314L includes byte positions PS0 through PS3, which store the product output from Galois field multipliers $306_0$ through $306_3$ that result from the finite field multiplication of byte locations A0, L0; A1, L1; A2, L2, and A3, L3, respectively. Partial product register 314H similarly includes byte positions PS4 through PS7, for storing the product output from the finite field multiplication, by Galois field multipliers $306_0$ through $306_3$, of byte locations A4, L4; A5, L5; A6, L6, and A7, L7.

The generation of the sum of the products in root detection unit 300' according to this alternative embodiment of the present invention is performed by Galois field adders 318H, 318L, 320. In this example, Galois field adder 318H receives the contents of register 314H, and generates a sum of the contents of byte locations PS7, PS6, PS5, PS4 therein by way of Galois field type finite field addition. Similarly, Galois field adder 318L sums the contents of byte locations PS3, PS2, PS1, PS0 of register 314L, according to Galois field addition. The sums generated by Galois field adders 314H, 314L are then applied to Galois filed adder 320, which generates a final sum, again according to finite field arithmetic, and applies this sum to zero detection circuit 206 for determination of whether a root was found in this iteration (as indicated by a sum equal to zero)

According to this embodiment of the invention, further efficiency in the operation of Chien search unit 116 is obtained, as no temporary register is necessary for the storage of the first partial sum result. Accordingly, a clear operation is not required in each pass through root detection unit 300', as is required in root detection unit 300 of FIG. 12. As a result, at least one additional clock cycle is eliminated from the Chien search operation according to the embodiment of the invention illustrated in FIG. 14 and described hereinabove; of course, this additional efficiency is obtained at the cost of an additional register.

Further in the alternative, it is contemplated that separate instructions may be provided for execution of Galois field multiplication, and for the Galois field summation and zero detection processes, described hereinabove, as opposed to an overall Chien search reduction process as described herein. For example, a Galois field multiplication process may be executed upon α and Λ values retrieved from general-purpose source registers, in response to a Galois field multiplication instruction, using Galois field multiplication circuitry provided within a Chien search execution unit; the results of the execution of this Galois field multiplication instruction may then be stored in destination general-purpose registers. The Galois field multiplication instructions may then be followed by the execution of a Chien search reduction instruction, by way of which the Chien search execution unit retrieves the products of the Galois field multiplication instructions, and then performs the appropriate Galois field addition, in combination with zero detection processing and the setting of the zeroes and position registers upon the detection of a root. It is contemplated that such multiple instruction operations may be preferred, in some architectures, over a single Chien search instruction.

It is further contemplated that still other alternative realizations of the root detector unit, and the Chien search unit in general, will also be apparent to those of ordinary skill in the art having reference to this specification, such additional alternatives being within the scope of the present invention.

The present invention, in providing programmable logic devices with efficient functionality as useful in Reed-Solomon decoding, will have a wide range of applications. These applications may include circuitry within computer systems, such as in retrieving data and program code from mass storage devices, as well as within network interface cards and the like. Other devices which are not usually thought of as computer systems, but which include significant programmable processing power, may also benefit from the present invention, such devices including digital wireless telephones, compact disk and other digital media players, and the like.

Figure 15:
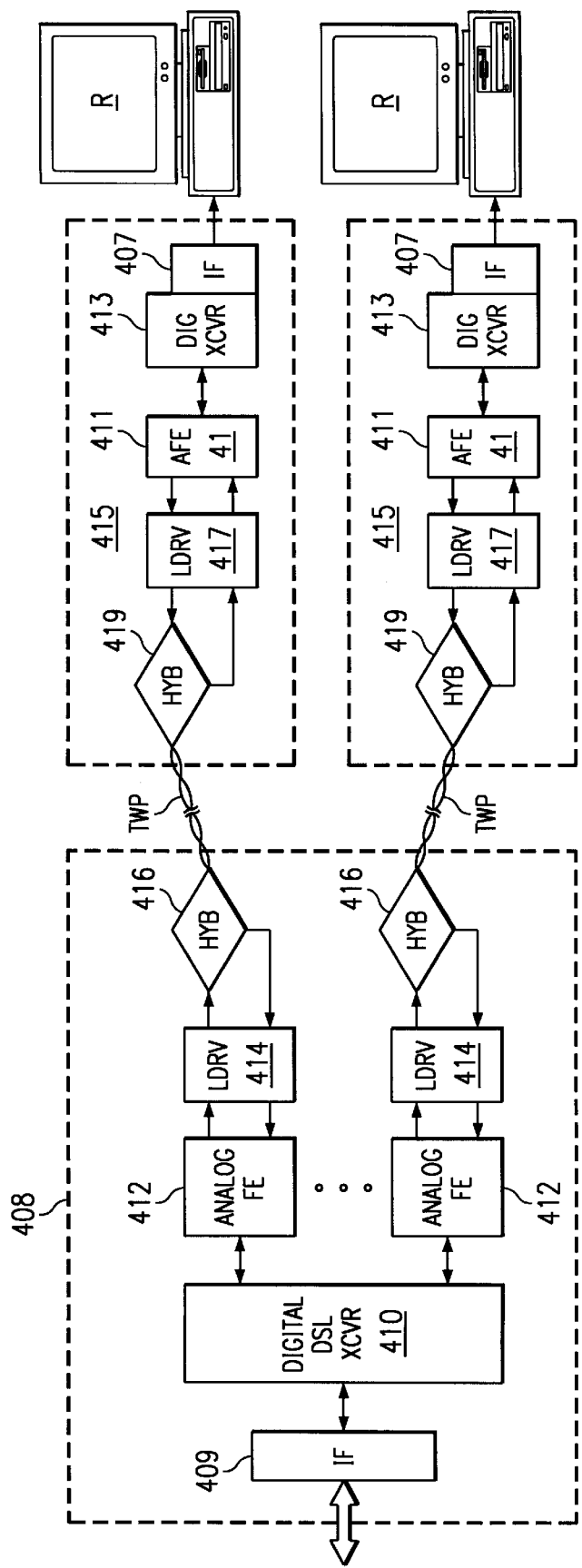
FIG. 15 is an electrical diagram, in block form, of an example electronic system of digital subscriber line (DSL) modems of the asynchronous type, in which the modem at the remote user differs from that at the telephone system central office.

Referring now to FIG. 15, an example of an electronic system into which the present invention may be beneficially implemented will now be described by way of example; this exemplary system corresponds to digital subscriber line (DSL) modems, particularly those of the asynchronous type (i.e., ADSL modems), in which the modem at the remote user differs from that at the telephone system central office. As communications carried out by modems over telephone lines typically involves Reed-Solomon decoding, it is contemplated that the present invention will be particularly beneficial in this application. As such, FIG. 15 illustrates an example of such an application, in which DSP 130 as described above is included within digital subscriber line (DSL) modems in a telecommunications system.

FIG. 15 illustrates a typical system installation of DSL services, in which multiple remote subscribers interface with a telephone system central office. In this example, a user in a home or office environment operates remote computer system R, such as a personal computer or workstation, or alternatively an entertainment unit in the video-on-demand (VOD) context. Each of remote computer systems R serves as a remote source and destination of communicated data, which may be representative of text, graphics, motion pictures, audio, etc. Each remote system R is associated with a remote DSL modem 415, by way of which the remote system R communicates with central office DSM modem 408 over a conventional twisted-pair telephone facility TWP. One or more telephones (not shown) may also be connected into each twisted pair wire facility TWP, such that "Plain Old Telephone Service" (POTS) voice communications may alternatively or additionally be communicated over twisted pair wire facility TWP. The DSL technology in the specific example of FIG. 15 may be of the asymmetric type (i.e., ADSL), with traffic traveling from central office modem 408 to remote modems 415 at a signal bandwidth that is higher in frequency than that of traffic traveling from remote modems 415 to central office modem 408 (i.e., upstream).

As illustrated in FIG. 15, each of twisted pair wire facilities TWP is received by central office DSL modem 408, which is contemplated to be located in a central office of the local or long distance telephone service provider. Central office modem 408, in this example, is capable of receiving multiple twisted pair wire facilities TWP (only two of which are illustrated in this example). Central office modem 408 provides communication of data between twisted pair wire facilities TWP, and thus remote systems R, and a host computer (not shown in FIG. 15) which serves as the source or destination of data, or as an intermediate gateway to a network, such as the Internet, or a dedicated "dial-up" content provider or network. Of course, the central office will typically also include switchgear for the routing of calls such as those placed by remote systems R (or associated telephones) over twisted pair wire facilities TWP. As noted above, central office modem 408 will likely be connected to a backbone network, which in turn is in communication with other communication paths by way of equipment such as routers or Digital Subscriber Line Access Multiplexers (DSLAMs). In the application where POTS service overlays the ADSL data traffic, such equipment may also include some type of "splitter" for separating POTS from the data traffic, routing the POTS traffic to the conventional telephone network (PSTN) and routing the data to a wide-area network (WAN).

In the example of FIG. 15, remote DSL modems 415 are each arranged as a plurality of functions, which roughly correspond to individual integrated circuits in this exemplary embodiment of the invention. It is of course to be understood that the particular integrated circuit, or "chip", boundaries among these various functions may vary among implementations; the exemplary realization illustrated in FIG. 15 is provided by way of example only. In this example, each of remote DSL modems 415 include a host interface 407, for interfacing digital transceiver function 413 with its associated remote system R. Host interface 407 is of conventional construction for such interface functions, an example of which is the TNETD2100 digital serial bus interface circuit available from Texas Instruments Incorporated.

According to this embodiment of the invention, digital transceiver function 413 in remote DST modems 415 is a programmable device for executing the necessary digital processing operations for both transmission and receipt of the data payload. These operations include such functions as formatting of the digital data from the host computer system (into packets and frames, for example), encoding of the data into appropriate subchannels for transmission, and performing an inverse Fast Fourier Transform (IFFT) to transform the encoded data into time domain signals; on the receive side, digital transceiver function 413 performs the reverse of these operations, as well as echo cancellation processing. Particularly at the data rates discussed hereinabove, the digital data processing capacity and power of digital transceiver function 413 is preferably of a high level, preferably with capability on the order of that provided as digital signal processors of the TMS320C6x type, available from Texas Instruments Incorporated. According to the preferred embodiment of the invention, digital transceiver function 413 is implemented by way of DSP 130 described hereinabove, and having dedicated Euclidean array unit 115 and Chien search unit 116 provided therein. Accordingly, for the receipt of encoded information, digital transceiver function 413 according to the preferred embodiment is able to perform these important Reed-Solomon decoding operations in an efficient manner, under the control of instructions in the instruction set of DSP 130. The Reed-Solomon decoding operation carried out by digital transceiver function 413, implemented as DSP 130 according to the preferred embodiment of the invention, is applied to encoded signals that are communicated over its associated twisted pair facility TWP from central office modem 408, and which are processed through hybrid 419, line driver 415, and AFE 411, so as to be received by digital transceiver function 413 in digital form. Following the Reed-Solomon decoding operation carried out by way of digital transceiver function 413, implemented as DSP 130 according to the preferred embodiment of the invention, the decoded digital signals are then communicated to remote system R via interface 407.

Each digital transceiver function 413 is bidirectionally connected to AFE 411, which is a mixed-signal (i.e., involving both digital and analog operations) integrated circuit which provides all loop interface components necessary for DSL communications other than those which involve high voltages. In this regard, AFEs 411 in each of remote DSL modems 415 perform both transmit and receive interface functions. In turn, AFEs 411 in each of remote modems 415 bidirectionally interface with line driver 417, which is a high-speed line driver and receiver for driving and receiving the ADSL signals on twisted pair facility TWP, such as the THS6002 line driver available from Texas Instruments Incorporated. Line drivers 417 in remote modems 415 are connected to a four-wire to two-wire "hybrid" integrated circuit 419, which converts the dedicated transmit and receive lines from line driver 417 to the two-wire arrangement of twisted pair facility TWP, in full-duplex fashion.

In the central office, central office DSL modem 408 includes host interface 409, which connects modem 408 to a host computer (not shown). Host interface 409 may, as noted above, be implemented by conventional circuitry such as the TNETD2100 digital serial bus interface circuit available from Texas Instruments Incorporated. As noted above, the host computer will interface central office modem 408 to a splitter for separating POTS from the data traffic, as noted above, and thus to the conventional telephone network (PSTN) and wide-area network (WAN) as appropriate for the service being provided. Central office modem 408 includes digital DSL transceiver function 410, which connects to multiple analog front end functions (AFEs) 412 as shown in FIG. 15. As in the case of remote DSL modems 415, AFEs 412 provide all loop interface components necessary for DSL communications other than those which involve high voltages, for both transmit and receive interface functions.

Digital transceiver function 410 is similarly constructed as and performs similar processing to digital transceiver functions 413 in remote DSL modems 415, with certain differences in function arising from the different frequencies of its received and transmitted traffic. As before, digital transceiver function 410 is preferably implemented as a high-performance digital signal processor, such as DSP 130 described hereinabove, so that Reed-Solomon decoding may be efficiently carried out thereby. As in the case of remote DSL modems 415, such construction includes dedicated Euclidean array unit 115 and Chien search unit 116 therein, so that these important Reed-Solomon decoding operations in an efficient manner, under the control of instructions in the instruction set of DSP 130. The Reed-Solomon decoding operation carried out by digital transceiver function 410, implemented as DSP 130 according to the preferred embodiment of the invention, is applied to encoded signals that are communicated over its associated twisted pair facility TWP from remote modem 415, after processing via hybrid 416, line driver 414, and AFE 412. Following the Reed-Solomon decoding operation carried out by way of digital transceiver function 410, implemented as DSP 130 according to the preferred embodiment of the invention, the decoded digital signals are then communicated to the central office host computer via interface 409.

The advantages of the present invention as obtained in the DSL modem application are also, as noted above, useful in many other applications in which Reed-Solomon or similar decoding is required. The DSL modem implementation shown in FIG. 15 and described hereinabove is provided by way of example only.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A programmable logic device, comprising:

control circuitry, for receiving program instructions and for generating control signals responsive thereto;

a data bus; and a Chien search execution unit coupled to the data bus, for executing a Chien search instruction under the control of the control circuitry, and comprising:

a plurality of finite field multipliers, each for performing finite field multiplication upon a symbol value and a coefficient to produce a product;

finite field addition circuitry, for performing finite field addition of the products from the plurality of finite field multipliers to produce a final sum;

zero detection circuitry, coupled to an output of the finite field addition circuitry, for generating a root detection signal responsive to the final sum equaling zero;

error magnitude and position circuitry, coupled to receive the root detection signal, for storing error magnitude and position values in selected registers responsive to receiving the root detection signal;

a symbol register, having outputs coupled to the plurality of finite field multipliers, for storing the symbol values; and a coefficient register, having outputs coupled to the plurality of finite field multipliers, and having inputs coupled to outputs of the plurality of finite field multipliers, for storing the coefficients applied to the plurality of finite field multipliers, and for storing the products from the plurality of finite field multipliers.

2. The programmable logic device of claim 1, wherein the symbol register comprises first and second pluralities of storage locations;

wherein the coefficient register comprises first and second pluralities of storage locations;

and wherein the plurality of finite field multipliers are selectably operable to perform finite field multiplication of symbol values from the first plurality of storage locations of the symbol register with coefficients from the first plurality of storage locations of the coefficient register, and to perform finite field multiplication of symbol values from the second plurality of storage locations of the symbol register with coefficients from the second plurality of storage locations of the coefficient register.

3. A programmable logic device, comprising:

control circuitry, for receiving program instructions and for generating control signals responsive thereto;

a data bus; and a Chien search execution unit coupled to the data bus, for executing a Chien search instruction under the control of the control circuitry, and comprising:

a plurality of finite field multipliers, each for performing finite field multiplication upon a symbol value and a coefficient to produce a product;

finite field addition circuitry, for performing finite field addition of the products from the plurality of finite field multipliers to produce a final sum, said finite field addition circuitry comprising;

a first finite field adder stage, for performing finite field addition of products from the plurality of finite field multipliers to produce a plurality of partial sums, and a final stage finite field adder, for performing finite field addition of the plurality of partial sums from the first finite field adder stage, to produce the final sum;

zero detection circuitry, coupled to an output of the finite field addition circuitry, for generating a root detection signal responsive to the final sum equaling zero; and error magnitude and position circuitry, coupled to receive the root detection signal, for storing error magnitude and position values in selected registers responsive to receiving the root detection signal.

4. The programmable logic device of claim 3, wherein the finite field addition circuitry further comprises:

a temporary register, coupled to an output of the final stage finite field adder, for storing a first iteration of the final sum;

wherein the final stage finite field adder has an additional input coupled to the temporary register, so that the final stage finite field adder is for performing finite field addition of the plurality of partial sums from the first finite field adder stage with the contents of the temporary register, to produce the final sum.

5. The programmable logic device of claim 3, wherein the finite field addition circuitry further comprises:

a first partial product register, having inputs coupled to outputs of each of the plurality of finite field multipliers, for storing a first plurality of products generated by the plurality of finite field multipliers; and a second partial product register, having inputs coupled to outputs of each of the plurality of finite field multipliers, for storing a second plurality of products generated by the plurality of finite field multipliers;

wherein the first finite field adder stage has inputs coupled to the first and second partial product registers, and is for performing finite field addition of the contents of the first and second partial product registers to produce a plurality of partial sums.

6. A method of operating a programmable logic device to execute a Chien search operation comprising the steps of:

loading coefficient values into a coefficient register;

in a first pass, performing the steps of:

performing finite field multiplication of a plurality of pairs of coefficient values and paired powers of zero order symbol values to produce a first plurality of finite field products;

storing the first plurality of finite field products into the coefficient register;

summing the first plurality of finite field products to produce a first final sum;

responsive to the first final sum indicating that the zero order symbol value generated a root, storing corresponding magnitude and position values into magnitude and position registers; and loading a plurality of symbol value powers into a symbol value register; and then, for each of a subsequent plurality of passes, performing the steps of:

performing finite field multiplication of a plurality of pairs of coefficient values and symbol value powers to produce a subsequent plurality of finite field products;

storing the subsequent plurality of finite field products into the coefficient register;

summing the subsequent plurality of finite field products to produce a subsequent final sum; and responsive to the subsequent final sum indicating generation of a root, storing corresponding magnitude and position values into magnitude and position registers.

7. The method of claim 6, wherein the step of performing finite field multiplication of a plurality of pairs of coefficient values and symbol value powers to produce a subsequent plurality of finite field products comprises:

performing finite field multiplication of a first group of the plurality of pairs of coefficient values and symbol value powers to produce a first group of finite field products;

storing the first group of finite field products in the coefficient register;

performing finite field multiplication of a second group of the plurality of pairs of coefficient values and symbol value powers to produce a second group of finite field products; and storing the second group of finite field products into the coefficient register.

8. The method of claim 7, wherein the step of summing the subsequent plurality of finite field products comprises:

after the step of performing, finite field multiplication of the first group of the plurality of pairs of coefficient values and symbol value powers, performing finite field addition of the first group of finite field products to produce a first sum;

storing the first sum in a register;

after the step of performing finite field multiplication of a second group of the plurality of pairs of coefficient values and symbol value powers, performing finite field addition of the second group of finite field products and the first sum to produce the subsequent final sum.

9. The method of claim 7, wherein the step of summing the subsequent plurality of finite field products comprises:

after the step of performing finite field multiplication of the first group of the plurality of pairs of coefficient values and symbol value powers, storing the first group of finite field products in a first register;

after the step of performing finite field multiplication of the second group of the plurality of pairs of coefficient values and symbol value powers, storing the second group of finite field products in a second register;

then performing finite field addition of the first and second groups of finite field products to produce the subsequent final sum.

10. The method of claim 7, further comprising:

decoding an instruction corresponding to the Chien search operation to generate control signals;

carrying out the generating step responsive to the control signals.

11. An electronic system, comprising:

an interface for receiving signals, in the form of encoded digital data; and a programmable logic device, comprising:

control circuitry, for receiving program instructions and for generating control signals responsive thereto;

a data bus;

a Chien search execution unit coupled to the data bus, for executing a Chien search instruction under the control of the control circuitry, and comprising:

a plurality of finite field multipliers, each for performing finite field multiplication upon a symbol value and a coefficient to produce a product;

finite field addition circuitry, for performing finite field addition of the products from the plurality of finite field multipliers to produce a final sum;

zero detection circuitry, coupled to an output of the finite field addition circuitry, for generating a root detection signal responsive to the final sum equaling zero;

error magnitude and position circuitry, coupled to receive the root detection signal, for storing error magnitude and position values in selected registers responsive to receiving the root detection signal;

a symbol register, having outputs coupled to the plurality of finite field multipliers, for storing the symbol values;

a coefficient register, having outputs coupled to the plurality of finite field multipliers, and having inputs coupled to outputs of the plurality of finite field multipliers, for storing the coefficients applied to the plurality of finite field multipliers, and for storing the products from the plurality of finite field multipliers.

12. The system of claim 11, wherein the symbol register comprises first and second pluralities of storage locations;

wherein the coefficient register comprises first and second pluralities of storage locations;

and wherein the plurality of finite field multipliers are selectably operable to perform finite field multiplication of symbol values from the first plurality of storage locations of the symbol register with coefficients from the first plurality of storage locations of the coefficient register, and to perform finite field multiplication of symbol values from the second plurality of storage locations of the symbol register with coefficients from the second plurality of storage locations of the coefficient register.

13. An electronic system, comprising:

an interface for receiving signals, in the form of encoded digital data; and a programmable logic device, comprising:
control circuitry, for receiving program instructions and for generating control signals responsive thereto;
a data bus;
a Chien search execution unit coupled to the data bus, for executing a Chien search instruction under the control of the control circuitry, and comprising:
a plurality of finite field multipliers, each for performing finite field multiplication upon a symbol value and a coefficient to produce a product;

finite field addition circuitry, for performing finite field addition of the products from the plurality of finite field multipliers to produce a final sum, said finite field addition circuitry comprising:
a first finite field adder stage, for performing finite field addition of products from the plurality of finite field multipliers to produce a plurality of partial sums, and
a final stage finite field adder, for performing finite field addition of the plurality of partial sums from the first finite field adder stage, to produce the final sum;

zero detection circuitry, coupled to an output of the finite field addition circuitry, for generating a root detection signal responsive to the final sum equaling zero; and error magnitude and position circuitry, coupled to receive the root detection signal, for storing error magnitude and position values in selected registers responsive to receiving the root detection signal.

14. The system of claim 13, wherein the finite field addition circuitry further comprises:

a temporary register, coupled to an output of the final stage finite field adder, for storing a first iteration of the final sum;

wherein the final stage finite field adder has an additional input coupled to the temporary register, so that the final stage finite field adder is for performing finite field addition of the plurality of partial sums from the first finite field adder stage with the contents of the temporary register, to produce the final sum.

15. The system of claim 13, wherein the finite field addition circuitry further comprises:

a first partial product register, having inputs coupled to outputs of each of the plurality of finite field multipliers, for storing a first plurality of products generated by the plurality of finite field multipliers; and a second partial product register, having inputs coupled to outputs of each of the plurality of finite field multipliers, for storing a second plurality of products generated by the plurality of finite field multipliers;

wherein the first finite field adder stake has inputs coupled to the first and second partial product registers, and is for performing finite field addition of the contents of the first and second partial product registers to produce a plurality of partial sums.

* * * * *